(12) United States Patent
Funami et al.

(10) Patent No.: US 7,453,335 B2
(45) Date of Patent: Nov. 18, 2008

(54) SURFACE ACOUSTIC WAVE RESONATOR, SURFACE ACOUSTIC WAVE FILTER AND SURFACE ACOUSTIC WAVE DUPLEXER, AND COMMUNICATIONS EQUIPMENT

(75) Inventors: Masayuki Funami, Kyoto (JP); Yuuko Yokota, Kyoto (JP); Kiyohiro Iioka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 303 days.

(21) Appl. No.: 11/392,484

(22) Filed: Mar. 28, 2006

(65) Prior Publication Data

US 2006/0214748 A1    Sep. 28, 2006

(30) Foreign Application Priority Data

Mar. 28, 2005 (JP) ............................ 2005-092829
Aug. 30, 2005 (JP) ............................ 2005-249318

(51) Int. Cl.
*H03H 9/25* (2006.01)
*H03H 9/64* (2006.01)
*H03H 9/72* (2006.01)

(52) U.S. Cl. ............... 333/195; 310/313 D; 333/133
(58) Field of Classification Search ............... 333/195; 310/313 D
See application file for complete search history.

(56) References Cited

U.S. PATENT DOCUMENTS 5,365,138 A * 11/1994 Saw et al. ............... 310/313 D 6,297,712 B1 * 10/2001 Kadota et al. ............... 333/133
7,034,634 B2 * 4/2006 Nakamura et al. .......... 333/133

FOREIGN PATENT DOCUMENTS

JP    06-009229       2/1994
JP    06-085604   *   3/1994   ............... 333/193

OTHER PUBLICATIONS

Machine translation of detailed description of JP 06-085604, Mar. 1994.*
Machine translation of detailed description of JP 06-009229 (cited by Applicants), Feb. 1994.*
Tsutsumi, et al., "Extremely Low-Loss Saw Filter and Its Application To Antenna Duplexer for The 1.9 GHz PCS Full-Band", Proceedings of the 2003 IEEE International Frequency Control Symposium, pp. 861-867.
Knuuttila, et al., "Asymmetric Acoustic Radiation in Leaky SAW Resonators on Lithium Tantalate" 1999 IEEE Ultrasonics Symposium, pp. 83-86.

* cited by examiner

*Primary Examiner*—Barbara Summons
(74) *Attorney, Agent, or Firm*—Hogan & Hartson LLP

(57) ABSTRACT

Disclosed is a surface acoustic wave resonator which comprises, on a piezoelectric substrate 19, an IDT electrode 1 including bus bar electrodes 12a, reflector electrodes 2 disposed to be adjacent to both sides of the IDT electrode 1 in a main propagation direction F of surface acoustic waves at the IDT electrode 1, and auxiliary reflector electrodes 3 that are disposed at four positions external to the reflector electrodes 2 on virtual straight lines extending from the bus bar electrodes 12a of the IDT electrode 1 in an inclined manner so that the periodic direction G of periodically arranged electrodes 14b is oriented toward the IDT electrode 1.

17 Claims, 18 Drawing Sheets

SURFACE ACOUSTIC WAVE RESONATOR, SURFACE ACOUSTIC WAVE FILTER AND SURFACE ACOUSTIC WAVE DUPLEXER, AND COMMUNICATIONS EQUIPMENT

BACKGROUND OF THE INVENTION

1. Field of the Invention

The present invention relates to a surface acoustic wave resonator with improved Q, a surface acoustic wave filter with improved insertion loss, a surface acoustic wave duplexer with isolation characteristics, insertion loss and power handling capability that are improved, and a communications equipment using the surface acoustic wave filter, the surface acoustic wave duplexer, or the surface acoustic wave resonator.

These surface acoustic wave resonator, surface acoustic wave filter and surface acoustic wave duplexer are collectively referred to as "surface acoustic wave device". Surface acoustic wave devices have been widely used, for example, in the mobile communication field as RF stage or IF stage filters of cellular phones.

2. Description of the Related Art

In recent years, light and small size surface acoustic wave devices with steep cutoff performance have been used as the component device for filters, delay lines, oscillators of electronic devices utilizing radio waves.

As one kind of the surface acoustic wave devices, a ladder-type surface acoustic wave filter has been known, which includes a plural number of one terminal-pair surface acoustic wave resonators disposed on the same piezolelectric substrate, in which the resonators are connected in series and parallel in a ladder-like manner.

Usually, a surface acoustic wave resonator comprises, as shown in FIG. 32, an IDT electrode 1 including bus bar electrodes 12a and electrode fingers 13 and reflector electrodes 2 disposed adjacent to the IDT electrode 1 on the both sides thereof in the direction in which the electrode fingers are periodically arranged, which is the main propagation direction of surface acoustic waves excited by the IDT electrode 1.

Since the ladder-type surface acoustic wave filter is a small size filter with low loss within the pass band, and high attenuation outside the pass band, it is widely used as RF stage filter for cellular phones and the like.

By using two in total of such ladder-type surface acoustic wave filters for the transmission side and the reception side, an antenna duplexer can be constructed.

A duplexer is a radio frequency component having the function to separate signals into signals of the transmission side frequency band (e.g. low frequency side frequency band) and signals of the reception side frequency band (e.g. radio frequency side frequency band).

While normally, a great electric power exceeding 1W is applied to the transmission filter of a duplexer, a part of surface acoustic waves excited by the IDT electrodes of the surface acoustic wave resonators constituting the transmission filter fails to be confined within the surface acoustic wave resonators but leaks outside the surface acoustic wave resonators and propagates on the piezoelectric substrate to be received by the IDT electrodes of the surface acoustic wave resonators constituting the receiving filter. Since the surface acoustic waves that have leaked are reconverted into electrical signals, a part of signals directed from the input terminal of the transmission filter to the antenna terminal leaks into the receiving filter, which deteriorates the S/N (signal/noise) ratio of received signals. The ratio of the electric power leaking to the receiving filter to the electric power at the input terminal of the transmission filter is called "isolation".

Recently, as the recent demand from the communications system side for products with improved specifications is becoming stronger, duplexers having superior isolation characteristics to (smaller leak power ratio than) those of conventional ones are longed for.

In addition, for further improved functionality of communications equipments, the number of components constituting the communications equipments has been increasing. For this reason, there has been a constant demand for miniaturization of the components.

Now, what causes surface acoustic waves to leak outside the surface acoustic wave resonator is described.

Surface acoustic waves excited by the IDT electrode generally propagate in a direction perpendicular to the longitudinal direction of the electrode fingers. This direction is referred to as the "main propagation direction". If the electrode fingers are so ideally formed as to have infinite lengths in the longitudinal direction, surface acoustic waves that propagate only in the main propagation direction are excited. However, since the real devices have finite sizes, surface acoustic waves that are actually excited are bound to include a component deviating from the main propagation direction.

As shown in FIG. 32, since the conventional surface acoustic wave resonator is formed such that the longitudinal lengths of the reflector electrodes 2 adjacent to the both ends of the IDT electrode 1 are almost the same as the longitudinal length of the IDT electrode 1, the reflector electrodes 2 fail to efficiently reflect the components deviating from the main propagation direction. As a result, the components deviating from the main propagation direction leak outside the surface acoustic wave resonator.

Although surface acoustic waves excited by the IDT electrode 1 include a plurality of frequency components, since in the reflector electrodes 2, the intervals between the periodic electrodes (also called "grating electrodes") are designed so that the best reflectivity is exerted for a specific frequency, surface acoustic waves with frequency components other than that are not reflected efficiently by the reflectors but leak outside the surface acoustic wave resonator.

In addition, when the propagation mode present in the main propagation path within the surface acoustic wave resonator and the propagation mode present in the bas bar electrodes 12a can be coupled, surface acoustic waves that are excited at intersection areas of the electrode fingers leak toward the bus bar electrodes 12a. Since the end portions of the bus bar electrodes 12a are not provided with a structure to confine surface acoustic waves, surface acoustic waves leak from the end portions of the bus bar electrodes 12a to the outside of the surface acoustic wave resonator. (e.g. refer to J. V. Knuuttila, J. Koskela, P. T. Tikka, and M. M. Salomaa, 1999 IEEE Ultrasonic Sympo., p83)

Thus, surface acoustic waves that leaked outside the surface acoustic wave resonator cause the foregoing problem. Although such a leak in duplexers was not regarded as a problem before, due to the recent strict demand for improved characteristics, it is becoming recognized as a problem.

SUMMARY OF THE INVENTION

A primary object of the present invention is to realize a high Q surface acoustic wave resonator by preventing surface acoustic waves from leaking outside the surface acoustic wave resonator.

Another object of the present invention is to realize a surface acoustic wave filter with a small size and low insertion loss by employing the surface acoustic wave resonator according to the present invention.

Still another object of the present invention is to realize a surface acoustic wave duplexer with a small size, which has excellent isolation characteristics, low insertion loss and excellent power handling capability by employing the surface acoustic wave resonator according to the present invention.

Yet another object of the present invention is to provide a communications equipment with low power consumption and good speech quality by employing the foregoing surface acoustic wave resonator, surface acoustic wave filter and surface acoustic wave duplexer of the present invention.

A surface acoustic wave resonator according to the present invention comprises: a piezoelectric substrate; an IDT electrode formed on the piezoelectric substrate including a bus bar electrode; reflector electrodes which are formed on the piezoelectric substrate and disposed to be adjacent to both sides of the IDT electrode in a main propagation direction of a surface acoustic wave at the IDT electrode; and an auxiliary reflector electrode formed on the piezoelectric substrate which includes periodically arranged electrodes and is disposed to be external to the reflector electrodes on a virtual straight line extending from the bus bar electrode of the IDT electrode.

In the surface acoustic wave resonator of this structure, surface acoustic waves that leak in directions other than the main propagation direction of surface acoustic waves at the IDT electrode and surface acoustic waves that leak from the bus bar electrode can be reflected by the auxiliary reflector electrode so as to be confined within the surface acoustic wave resonator. As a result, a surface acoustic wave resonator with high Q and low surface acoustic wave leakage loss can be realized.

The foregoing auxiliary reflector electrode is preferably formed such that the periodic direction of the periodically arranged electrodes (denoted by G in FIGS. 1, 11) is oriented toward the IDT electrode.

In particular, it is preferable that the angle $\theta$ made by the periodic direction of the periodically arranged electrodes of the auxiliary reflector electrode and the periodic direction of the electrode fingers of the IDT electrode is greater than 0° and not greater than 20°.

In addition, while the number of the auxiliary reflector electrode for one IDT electrode mentioned above is not limited, for example, the auxiliary reflector electrodes may be arranged at four positions obliquely outside the reflector electrodes.

The auxiliary reflector electrode may be the so-called ladder-type electrode that has two bus bar electrodes to which the both end portions of the periodically arranged electrodes of the auxiliary reflector electrode are connected.

The auxiliary reflector electrodes may also be a comb-type electrode in which one end portions of the periodically arranged electrodes are formed to be electrically open.

The auxiliary reflector electrodes may also be periodic electrodes in which both end portions of the periodically arranged electrodes are formed to be electrically open.

In addition, the auxiliary reflector electrode may be an IDT-type, which include two bus bar electrodes and have a configuration in which electrode fingers extending from the bus bar electrodes in a generally perpendicular direction are intersected with each other.

In the foregoing structure, the pitch of the auxiliary reflector electrode and the pitch of the reflector electrodes may be different from each other, which allows the structure to be designed such that the wavelengths at which the reflectivity of the auxiliary reflector electrode is high are different from the wavelengths at which the reflectivity of the reflector electrodes is high. This allows even the surface acoustic waves with wavelengths that fail to be reflected by the reflector electrodes to be efficiently reflected by the auxiliary reflector electrodes, thereby further suppressing leakage of surface acoustic waves to the outside of the surface acoustic wave resonator.

The surface acoustic wave resonator of the present invention allows the pitch of the auxiliary reflector electrode and the pitch of the IDT electrode to be different from each other, which makes it possible to suppress unwanted resonance generated between the auxiliary reflector electrode and the IDT electrode and thereby to realize a surface acoustic wave resonator with reduced spurious resonance. Here, a "pitch" means a distance between center lines of adjacent electrodes.

Furthermore, providing a second auxiliary reflector electrode between two auxiliary reflector electrodes to be external to the reflector electrodes allows surface acoustic waves that fail to be reflected by the reflectors to be reflected so as to be confined within the surface acoustic wave resonator. A high-Q surface acoustic wave resonator with further reduced surface acoustic wave leakage loss can be realized.

By a structure in which the second auxiliary reflector electrode and the auxiliary reflector electrode are connected to form an unitary piece, additionally, surface acoustic waves leaking between the second auxiliary reflector electrode and the auxiliary reflector electrode can be reflected to be confined within the surface acoustic wave resonator, thereby realizing a surface acoustic wave resonator with further improved Q. Also, since it is possible to equalize the potentials of the second auxiliary reflector electrode and the auxiliary reflector electrode, destruction of microelectrodes by sparks that are occasionally generated between parts of different potentials caused by pyroelectricity of the piezoelectric substrate can be prevented, and a surface acoustic wave resonator with high Q can therefore be realized.

In addition, a surface acoustic wave filter using the surface acoustic wave resonator according to the present invention can be a surface acoustic wave filter with low insertion loss, owing to the inclusion of high-Q surface acoustic wave resonator. The size of the surface acoustic wave filter can be made small, since a coupling of a surface acoustic wave generated in the transmission filter to the receiving filter can be prevented, and a transmission filter section and a receiving filter section can be mounted on one piezoelectric substrate.

Since a surface acoustic wave duplexer using the surface acoustic wave resonator of the present invention includes a transmission filter section and receiving filter section on a piezoelectric substrate, and the foregoing surface acoustic wave resonator in at least one of the transmission filter section and the receiving filter section, a surface acoustic wave duplexer with excellent isolation characteristics, low insertion loss, and excellent power handling capability can be realized, while the size thereof is small.

In addition, a communications equipment provided with the surface acoustic wave duplexer according to the present invention is capable of reducing input power required for obtaining the same output power because of the low insertion loss of the filter, allowing the consumption power of the power amplifier to be reduced, and accordingly, it can be a communications equipment with low power consumption. In addition, because of the small size of this surface acoustic wave duplexer, the mounting area for other components can be secured, thereby realizing a communications equipment with high functionality. Moreover, because of the excellent isolation characteristics, high speech quality can be obtained.

These and other advantages, features and effects of the present invention will be made apparent by the following description of preferred embodiments with reference to the accompanying drawings.

DETAILED DESCRIPTION OF PREFERRED EMBODIMENTS

Figure 1:
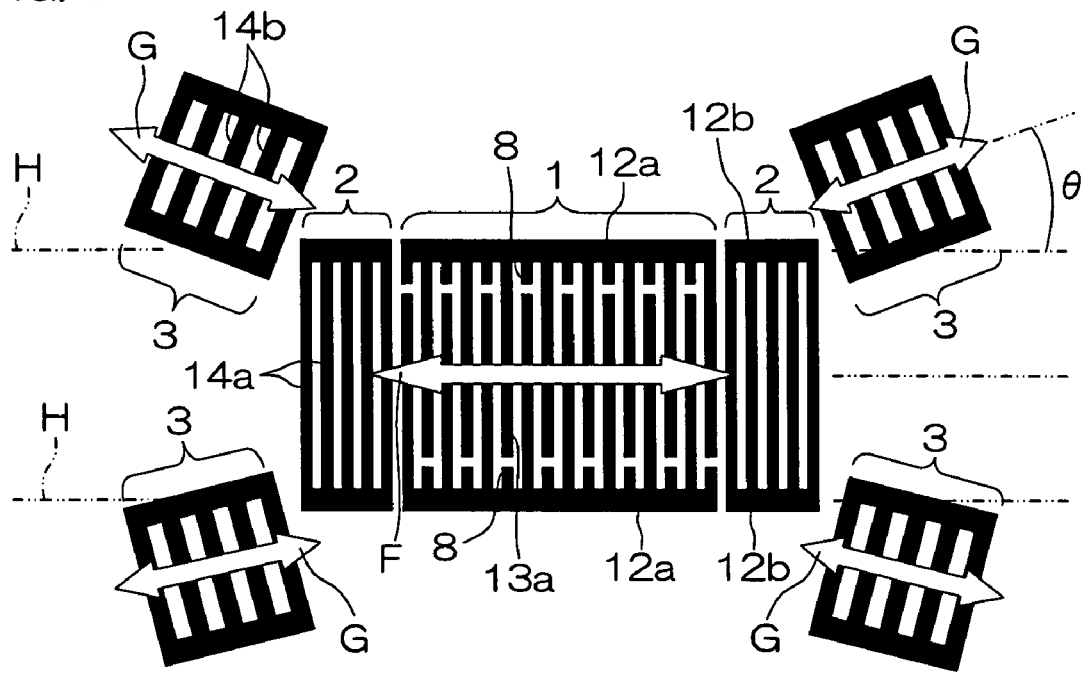
FIG. 1 is a plan view of one embodiment of the surface acoustic wave resonator according to the present invention.

Specific embodiments of the surface acoustic wave devices according to present invention will be hereinafter described in detail with reference to the accompanying drawings. In the drawings, like elements are denoted by like reference symbols. In addition, the sizes of the electrodes, distances between the electrodes, the number of electrode fingers and distances between them are schematically shown for illustration purpose only, and they are not limited thereto.

FIG. 1 shows a plan view of a surface acoustic wave resonator.

Figure 2:
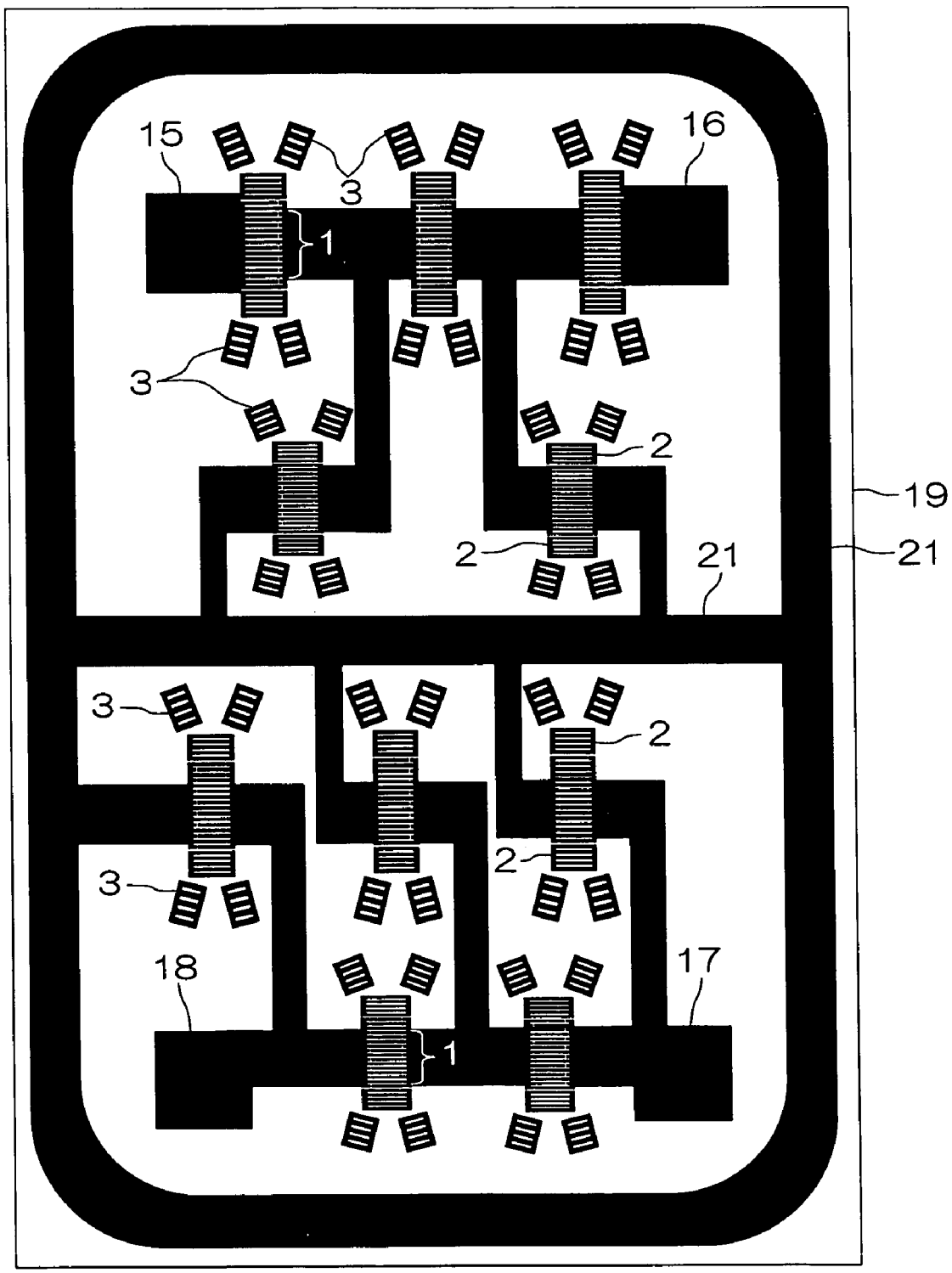
FIG. 2 is a schematic diagram of a surface acoustic wave duplexer as one example of the surface acoustic wave devices according to the present invention viewed from top.

This surface acoustic wave resonator is a device comprising a plurality of electrodes formed of thin films of metal formed on one principal surface of a piezoelectric substrate (See 19 of FIG. 2). The electrodes formed include an IDT electrode 1, reflector electrodes 2, and auxiliary reflector electrodes 3.

The IDT electrode 1 comprises two bus bar electrodes 12a extending in parallel to each other in the main propagation direction F of surface acoustic waves, and electrode fingers 13 each engaging with each other that are formed so as to extend perpendicularly inward from each of the bus bar electrodes 12a.

The reflector electrodes 2 are disposed to be adjacent to the both ends in the main propagation direction F of the IDT electrode 1. Each of the reflector electrodes 2 comprises two bus bar electrodes 12b extending in parallel to each other, and grating electrodes 14a that are formed so as to extend perpendicularly inward from each of the bus bar electrodes 12b. The grating electrodes 14a are different from the electrode fingers 13a in that the grating electrodes 14a are connected also to the bus bar electrodes 12b opposed to each other and short-circuited, while the electrode fingers 13a are not connected to the bus bar electrodes 12a opposed to each other.

The auxiliary reflector electrodes 3, four in number, are disposed on the sides of the reflector electrodes 2 that are not adjacent to the IDT electrode 1, that is, disposed at four positions outside the reflector electrodes 2. The four positions are located on virtual straight lines H drawn by extending each of the two bus bar electrodes 12a of the IDT electrode 1. The auxiliary reflector electrodes 3 also have short-circuited grating electrodes 14b as the reflector electrodes 2.

Meanwhile, the positions at which the auxiliary reflector electrodes 3 are disposed are not limited to the four positions outside the reflector electrodes 2. They may be disposed at only one position, or two or three of the foregoing four positions. The effect of the present invention, that is, preventing surface acoustic waves from leaking outside, and thereby improving Q can be obtained even if they are disposed at one to three positions.

Each of the auxiliary reflector electrodes 3 is disposed in an inclined manner so that the periodic direction (hereinafter referred to as the "direction G of auxiliary reflector electrode 3") of the grating electrodes 14b is oriented toward the IDT electrode 1. In other words, when viewed from the IDT electrode 1, each of the four auxiliary reflector electrodes 3 is disposed in a direction extending outward. The angle of inclination thereof is indicated by θ.

Figure 32:
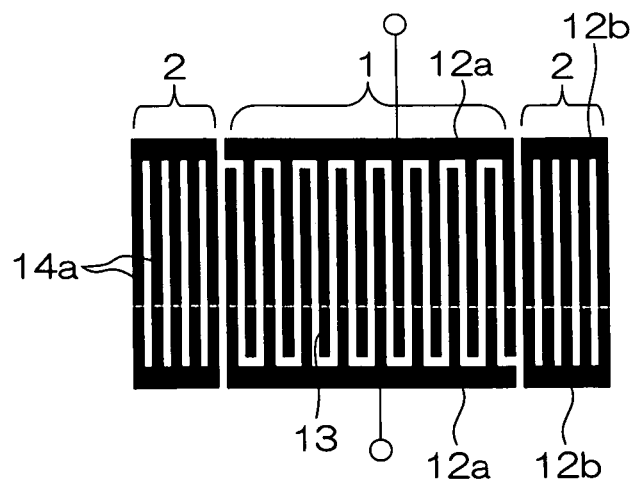
FIG. 32 is a plan view of a conventional surface acoustic wave resonator.

In the conventional structure (FIG. 32) without auxiliary reflector electrodes 3, surface acoustic waves that leak outside the reflector electrodes 2 are present. This is because the reflector electrodes 2 are arranged at a uniform pitch, so that surface acoustic waves leak when their wavelengths are other than the wavelength for this pitch at which surface acoustic waves are reflected.

In addition, there are cases where surface acoustic waves leak from the bus bar electrodes 12a of the IDT electrode 1. In that case, when mode coupling occurs between the surface acoustic waves that leaks and the propagation mode from the bus bar electrodes 12b of the reflector electrodes 2, surface acoustic waves eventually leak from the end portions of the bus bar electrodes 12b.

Therefore, by forming the auxiliary reflector electrodes 3 as shown in FIG. 1, surface acoustic waves leaking obliquely from the main propagation direction F making an angle of θ with it are reflected so that leakage of energy can be reduced.

Accordingly, effects such as improvement in the Q of the surface acoustic wave resonator, improvement in insertion loss of the surface acoustic wave filter and improvement in isolation of the surface acoustic wave duplexer can be obtained.

FIG. 2 is a schematic diagram viewed from top showing a surface acoustic wave duplexer including a transmission filter and a receiving filter which are formed on the same piezoelectric substrate 19 and employ surface acoustic wave resonators with the structure as shown in FIG. 1. In FIG. 2, the upper half shows the transmission filter section, and the lower half shows the receiving filter section.

Signals entered from an input terminal 15 of the transmission filter pass through three series-connected surface acoustic wave resonators and two parallel-connected surface acoustic wave resonators that are arranged in the form of a ladder to be outputted from an output terminal 16.

Signals entered from an input terminal 17 of the receiving filter pass through two series-connected surface acoustic wave resonators and three parallel-connected surface acoustic wave resonators to be outputted from an output terminal 18.

In addition, each of the surface acoustic wave resonators of the transmission filter and the receiving filter is provided with the foregoing auxiliary reflector electrodes 3 so as to form a structure that allows reduction of surface acoustic waves leaking to oblique directions from the main propagation direction F.

Meanwhile, the piezoelectric substrate 19 is provided with annular electrodes 21, which are provided for hermetically sealing the piezoelectric substrate 19 on a mounting substrate (not diagramed) by flip-chip bonding. Experiments have revealed that propagation of surface acoustic waves leaking from the surface acoustic wave resonators is hardly hindered by the presence of the annular electrodes 21.

Among the surface acoustic wave resonators constituting the transmission filter in the structure shown in FIG. 2, in particular, the structure of the present invention is advantageously applied to the series-connected surface acoustic wave resonators.

This is because surface acoustic waves with great strength that are excited while signals of a great power applied to the transmission filter are transmitted through the series-connected surface acoustic wave resonators can be confined efficiently by the present invention.

When the surface acoustic wave resonator according to the present invention is employed for the parallel-connected surface acoustic wave resonators of the receiving filter, surface acoustic waves leaking from the series-connected surface acoustic wave resonators of the transmission filter are reflected by the foregoing auxiliary reflector electrodes 3 used for the parallel-connected surface acoustic wave resonators of the receiving filter. As a result, their chances of being received by the IDT electrodes 1 constituting the parallel-connected surface acoustic wave resonators of the receiving filter are reduced, which exerts the effect of improving the isolation.

Incidentally, it is also possible to arrange the structure such that the pitch of the grating electrodes 14b of the auxiliary reflector electrodes 3 is different from the pitch of the grating electrodes 14a of the reflector electrodes 2.

For example, by an arrangement in which the pitch of the grating electrodes 14b of the auxiliary reflector electrodes 3 in the surface acoustic wave resonator used for the transmission filter, corresponds to the pitch of the electrode fingers 13 of the IDT electrode 1 in the surface acoustic wave resonator used for the receiving filter, isolation characteristics in the receiving frequency band can be improved. This is because the surface acoustic waves with wavelengths of the receiving frequency band that failed to be reflected by the reflector electrodes 2 are reflected by the auxiliary reflector electrodes 3 to be confined within the surface acoustic wave resonators of the transmission filter, so that leakage of the surface acoustic waves in the receiving frequency band is prevented.

Furthermore, it may be arranged such that a plurality of different pitches are used for the grating electrodes 14b of the auxiliary reflector electrodes 3. By this arrangement, it is possible to suppress not only surface acoustic waves in a specific frequency band but those in a wider frequency band that leak from the surface acoustic wave device and to thereby improve the Q of the surface acoustic wave resonator.

Meanwhile, in the drawings including FIG. 1, the aforementioned IDT electrode 1 includes short dummy electrodes 8 formed in regions of the bus bar electrodes 12a of one side facing the edges of the electrode fingers 13 formed in the bus bar electrodes 12a of the other side. This arrangement further reduces possibility of mode coupling between the propagation mode of the main propagation path and the propagation mode of the bus bar electrodes, so that surface acoustic waves can be reduced that leak outside of the main propagation path of the surface acoustic wave resonator to the bus bar electrodes, allowing the surface acoustic wave resonator to have high Q. When such surface acoustic wave resonators are used to construct a filter, a filter with reduced insertion loss can be realized. In addition, when a duplexer including a transmission filter section and a receiving filter section on the same substrate is constructed, it can have further improved isolation characteristics.

Meanwhile, while ladder-type electrodes (short-circuit reflectors) comprising grating electrodes 14b that are electrically short-circuited at their respective both end portions are used to construct the auxiliary reflector electrodes 3 shown in the drawings including FIG. 1, the configuration thereof is not limited to this one but may be, for example, a configuration in which their respective both end portions or one end portions are electrically open (open reflectors). Also in such a case, isolation characteristics can be improved.

Figure 3:
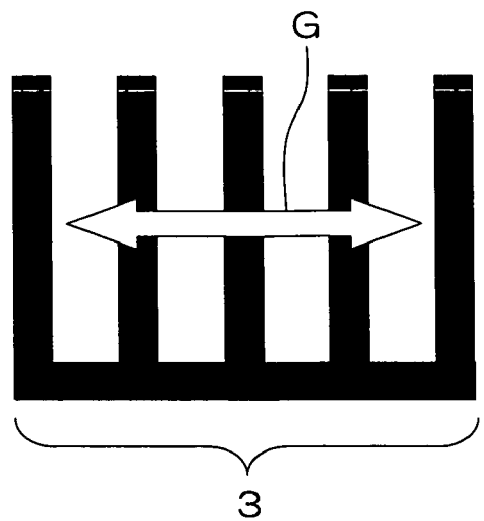
FIG. 3 is a schematic diagram of an auxiliary reflector electrode whose one end portion is electrically open.
Figure 4:
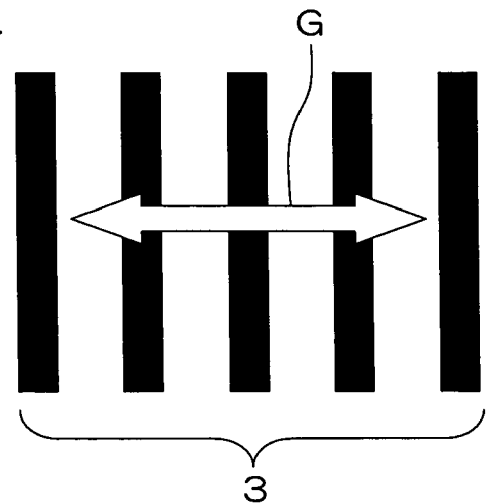
FIG. 4 is a schematic diagram of an auxiliary reflector electrode whose both end portions are electrically open.

FIG. 3 shows an example of an open reflector having open end portions on one side, and FIG. 4 shows an example of an open reflector having open end portions on both sides.

Furthermore, the configuration of the auxiliary reflector electrode 3 may be that of an IDT electrode (IDT-type reflector) in which electrode fingers are intersected with each other. This structure will be later described in detail.

In addition, the configuration of the auxiliary reflector electrode 3 may be formed by grating electrodes other than the grating electrodes comprising linear-shaped electrode fingers, such as those having an arc shape with a certain curvature, an inflexed or curved shape, or trapezoidal shape. By the foregoing arrangement, leaking surface acoustic waves can be reflected at a wide range of angles, which leads to advantageous effects such as improved Q of resonators, improved insertion loss of filters and improved isolation characteristics of duplexers.

In the surface acoustic wave resonator according to the present invention, single crystal lithium tantalite, single crystal lithium niobate, single crystal lithium tetraborate and the like may be employed for the piezoelectric substrate.

For the IDT electrode, reflector electrodes and the auxiliary reflector electrodes, materials such as aluminum, aluminum alloys, copper, copper alloys, gold, gold alloys, tantalum, tantalum alloys, multilayer films comprising layers of these materials, or multilayer films comprising layers of these materials and layers of titanium, chromium and the like may be used. For deposition of these layered films, processes such as sputtering, electron beam deposition, etc. may be used.

One of the processes for patterning the IDT electrode, reflector electrodes and the auxiliary reflector electrodes is a process in which photolithography is carried out after deposition of electrode films, which is followed by RIE (Reactive Ion Etching) or wet etching. Alternatively, the process may be carried out such that, before deposition of electrode films, a photoresist is applied to the surface of a piezoelectric substrate, then photolithography is carried out to form patterns of the desired IDT electrode and reflector electrodes, which is followed by deposition of single-layer or multilayer films comprising the foregoing materials such as aluminum, and thereafter, a lift-off process for removing the unwanted portions of single-layer or multilayer films together with the resist applied thereto is carried out.

Hereinafter, examples of modified shapes of the electrodes of the surface acoustic wave resonator formed on the piezoelectric substrate will be described.

Figure 5:
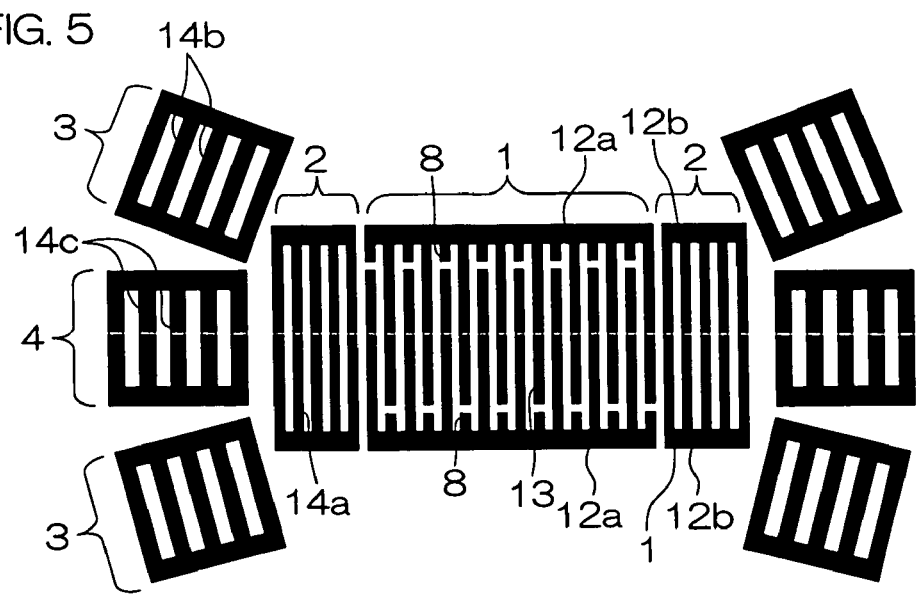
FIG. 5 is a plan view of another embodiment of the surface acoustic wave resonator according to the present invention.

As shown in FIG. 5, second auxiliary reflector electrodes 4 having grating electrodes 14c may be disposed at positions adjacent to the sides of the reflector electrodes 2 that are opposite to the sides thereof that are adjacent to the IDT electrode 1.

By the presence of the second auxiliary reflector electrodes 4, surface acoustic waves that propagate in a direction generally perpendicular to the electrode fingers of the IDT electrode 1 or along the main propagation direction of surface acoustic waves as mentioned above and fail to be reflected by the first reflector electrodes 2 can be reflected.

It is preferred that the pitch of the grating electrodes 14c of the second auxiliary reflector electrodes 4 is different from the pitch of the grating electrodes 14a of the reflector electrodes 2. This makes it possible to efficiently reflect the surface acoustic waves that have failed to be reflected by the reflector electrodes 2.

Incidentally, while the second auxiliary reflector electrodes 4 are shown as ladder-type electrodes (short-circuit reflectors) comprising bus bar electrodes and grating electrodes in FIG. 5, they may be IDT electrodes (IDT-type reflectors) comprising bus bar electrodes and electrode fingers, or may comprise only grating electrodes (open reflectors).

Furthermore, it may be arranged such that a plurality of different pitches are used for the grating electrodes 14c of the second auxiliary reflector electrodes 4. By this arrangement, it is possible to suppress not only surface acoustic waves in a specific frequency band but also those in a wider frequency band that leak from the surface acoustic wave device and to thereby improve the Q of the surface acoustic wave resonator. In this case, the spatial arrangement of the plurality of pitches is not particularly important, but may be determined freely.

Figure 6:
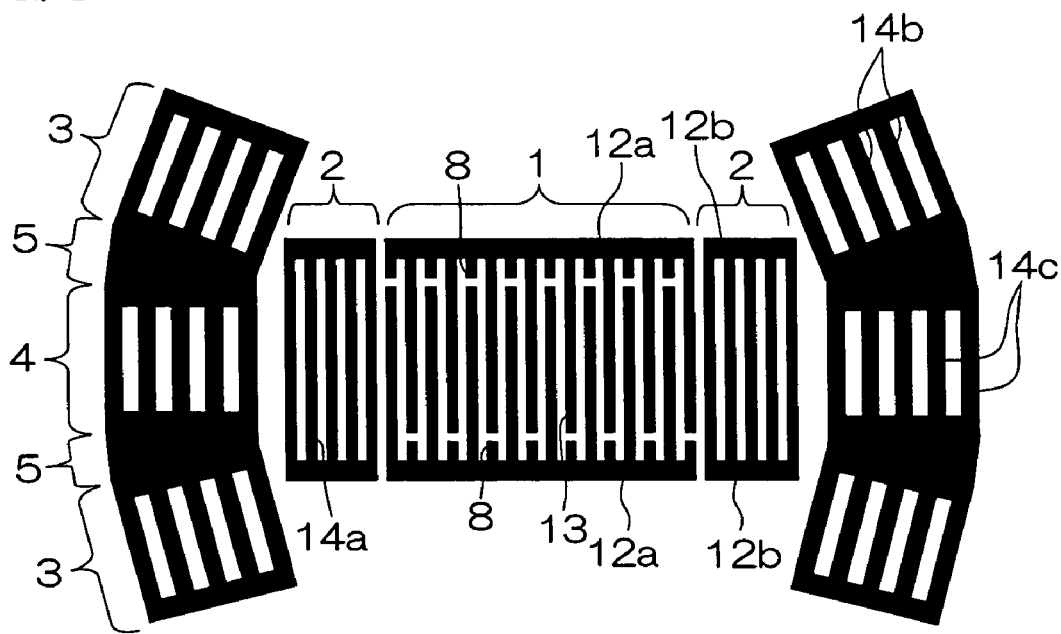
FIG. 6 is a plan view of still another embodiment of the surface acoustic wave resonator according to the present invention.

Furthermore, as shown in FIG. 6, the auxiliary reflector electrodes 3 and the second auxiliary reflector electrode 4 that are disposed adjacent to each other may be connected together by means of connecting sections 5 so as to form a unitary piece. Since this arrangement allows the electric potentials of the auxiliary reflector electrodes 3 and the second auxiliary reflector electrode 4 to be equal, it is possible to prevent destruction of microelectrodes due to sparks generated between regions with different electric potentials caused by pyroelectricity of the piezoelectric substrate, and to realize a surface acoustic wave resonator with high Q.

Meanwhile, when the auxiliary reflector electrodes 3 and the second auxiliary reflector electrode 4 are connected together to form a unitary piece, various patterns of connection are possible. For example, as shown in FIG. 6, the regions facing each other that are originally present in FIG. 5 can be extended as they are so as to be connected together.

Figure 7:
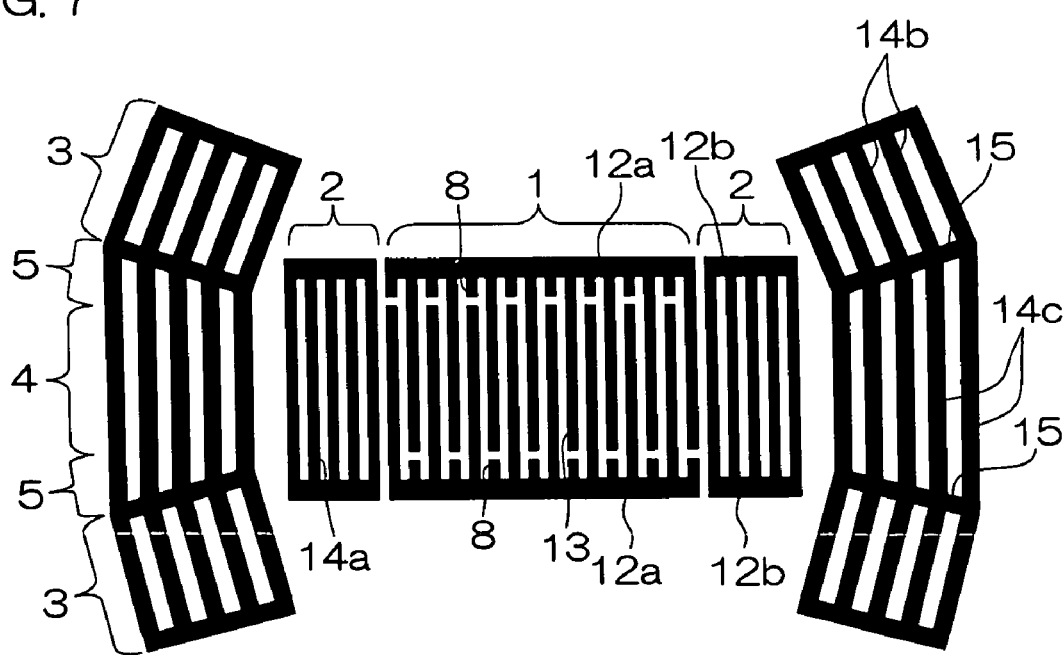
FIG. 7 is a plan view of still another embodiment of the surface acoustic wave resonator according to the present invention.
Figure 8:
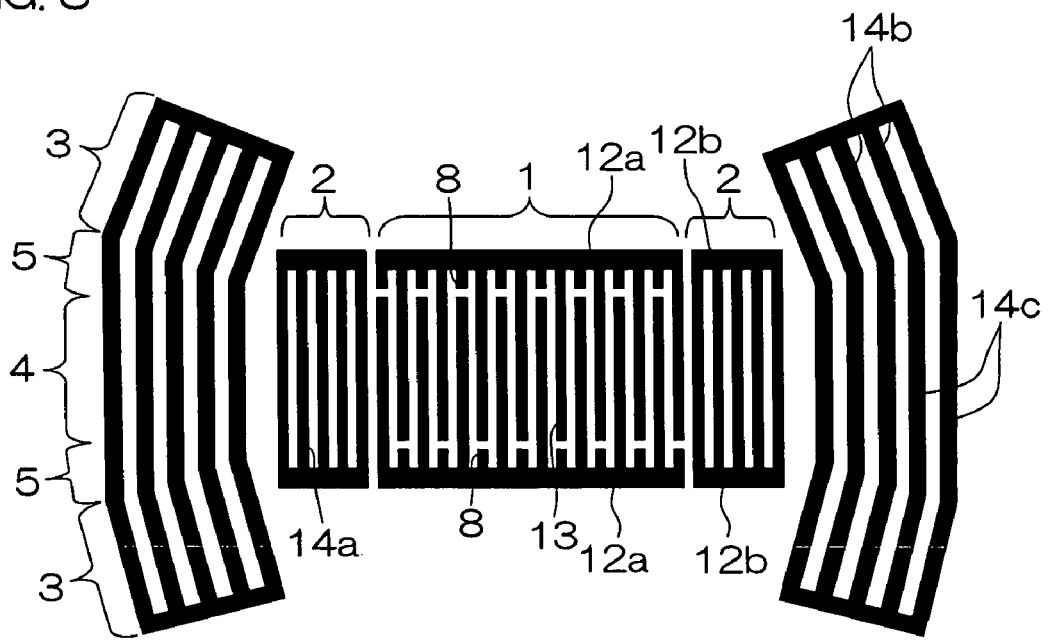
FIG. 8 is a plan view of still another embodiment of the surface acoustic wave resonator according to the present invention.

As shown in FIG. 7, a unitary piece may be formed by extending the grating electrodes 14b of the auxiliary reflector electrodes 3 and the grating electrodes 14c of the auxiliary reflector electrode 4. In such a case, reflector bus bar electrodes 15 for short-circuiting the grating electrodes may be provided, or not provided as the example shown in FIG. 8.

Figure 9:
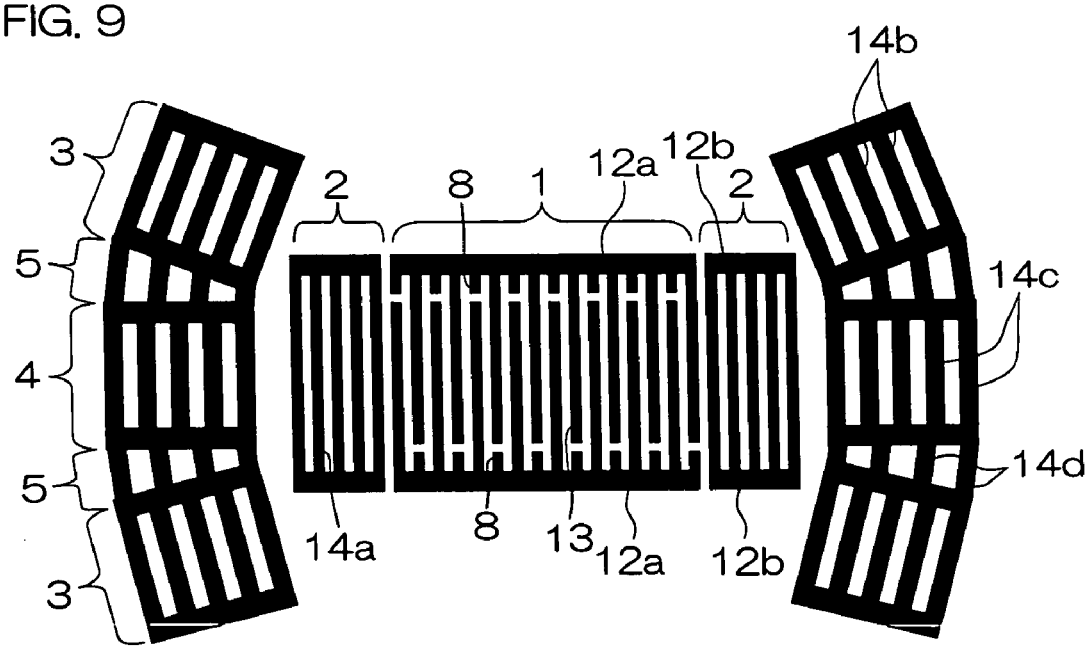
FIG. 9 is a plan view of still another embodiment of the surface acoustic wave resonator according to the present invention.

In addition, the structure may be such that grating electrodes 14d are provided between each of the auxiliary reflector electrodes 3 and the second auxiliary reflector electrode 4 as shown in FIG. 9. This structure additionally allows surface acoustic waves leaking between each of the auxiliary reflector electrodes 3 and the second auxiliary reflector electrodes 4 to be reflected and confined within the surface acoustic wave resonator, thereby realizing a surface acoustic wave resonator with higher Q.

Among the structures described so far, in particular, the structures shown in FIGS. 7 and 9 are advantageous because such structures allow the pitches of the grating electrodes to be optimum for various directions.

In addition, the configuration of the second auxiliary reflector electrode 4 may be formed by grating electrodes other than the grating electrodes comprising linear-shaped electrode fingers, such as those having an arc shape with a certain curvature, an inflexed or curved shape. By the foregoing arrangement, leaking surface acoustic waves can be reflected at a wide range of angles, which leads to advantageous effects such as improved Q of resonators, improved insertion loss of filters and improved isolation characteristics of duplexers.

Figure 10:
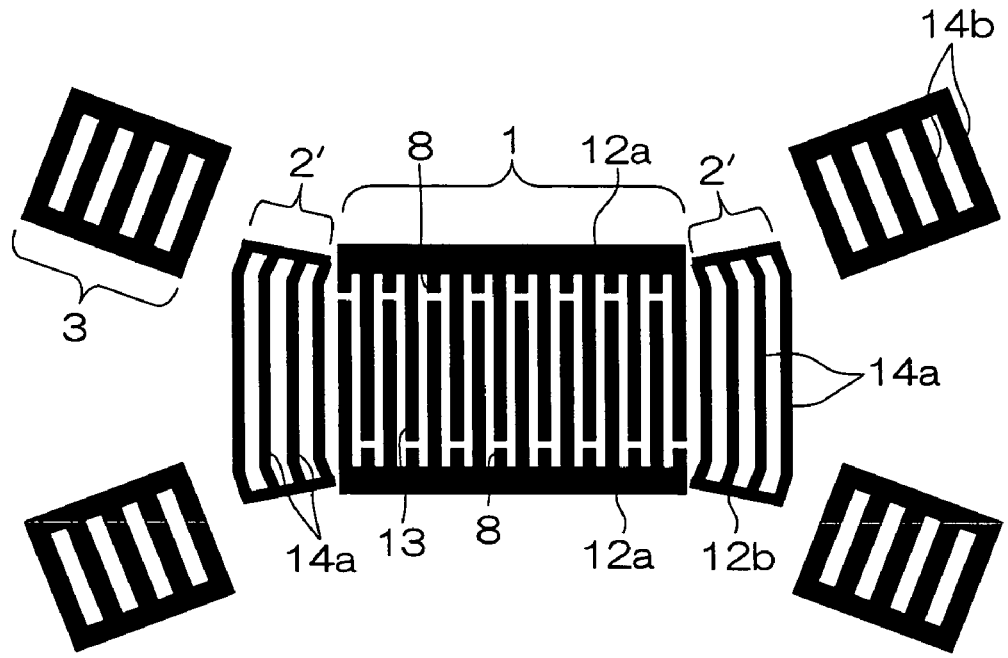
FIG. 10 is a plan view of still another embodiment of the surface acoustic wave resonator according to the present invention.

Alternatively, as shown in FIG. 10, instead of the reflector electrodes 2 with a geometry of a rectangle shown in FIG. 1, reflector electrodes 2' each having a configuration formed by the bus bar electrodes 12b of the reflector electrode inclined toward the IDT electrode 1 and the grating electrodes 14a of the reflector electrode having inflexed end portions may be used.

In addition, while the reflector electrodes 2' having a inflexed shape are shown in FIG. 10, they may have a smoothly curved shape.

The inflexed or curved configuration of the reflector electrodes 2' allows surface acoustic waves leaking from the IDT electrode 1 in directions other than the main propagation direction F of surface acoustic waves to be reflected by the reflector electrodes 2' with the inflexed or curved shape, enhancing the effect.

Figure 11:
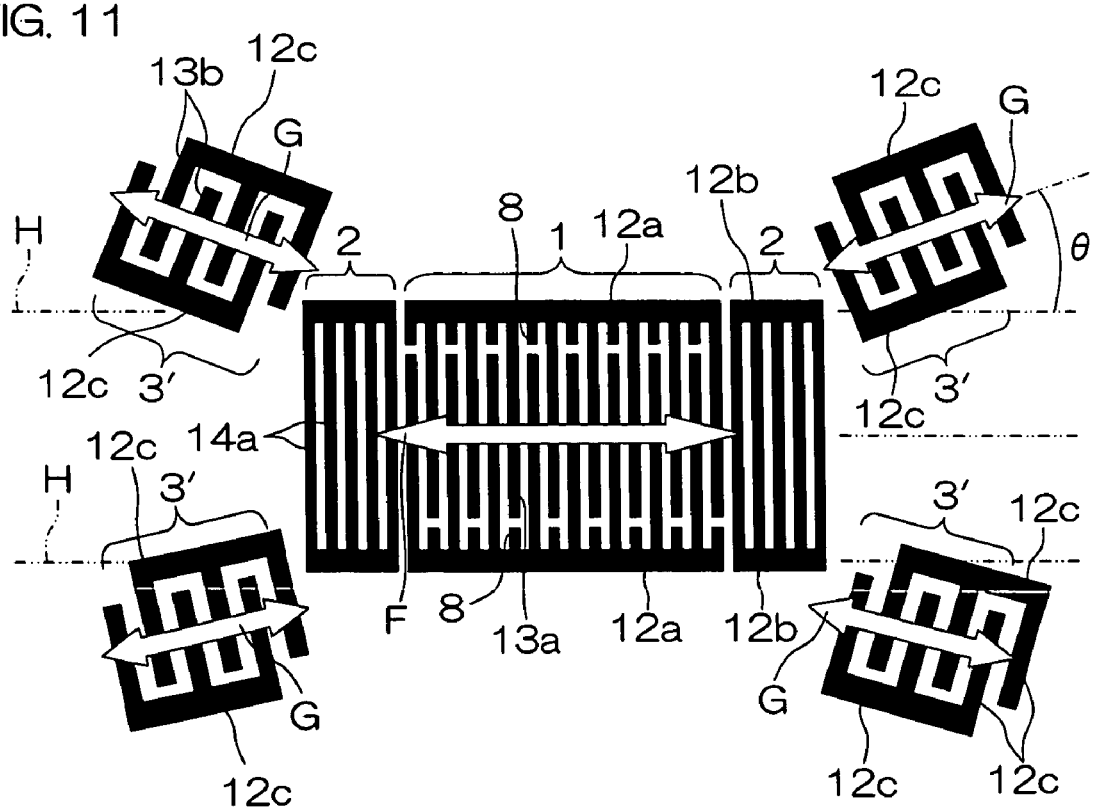
FIG. 11 is a plan view of still another embodiment of the surface acoustic wave resonator according to the present invention.

FIG. 11 is a plan view of an example including, instead of the auxiliary reflector electrodes 3 in FIG. 1, IDT-type auxiliary reflector electrodes 3' each having bus bar electrodes 12c and electrode fingers 13b, in which the electrode fingers 13b are intersected with each other.

The four positions at which the IDT-type auxiliary reflector electrodes 3' are disposed are located on virtual straight lines H extending from the bus bar electrodes 12a of the IDT electrode 1.

Each of the IDT-type auxiliary reflector electrodes 3' is disposed in an inclined manner so that the periodic direction (hereinafter referred to as the "direction of IDT-type auxiliary reflector electrode 3') G of each of the IDT-type auxiliary reflector electrodes 3' is oriented toward the IDT electrode 1.

Incidentally, since no signal lines are connected to the IDT-type auxiliary reflector electrodes 3', surface acoustic waves are not excited by the IDT-type auxiliary reflector electrodes themselves.

Figure 12:
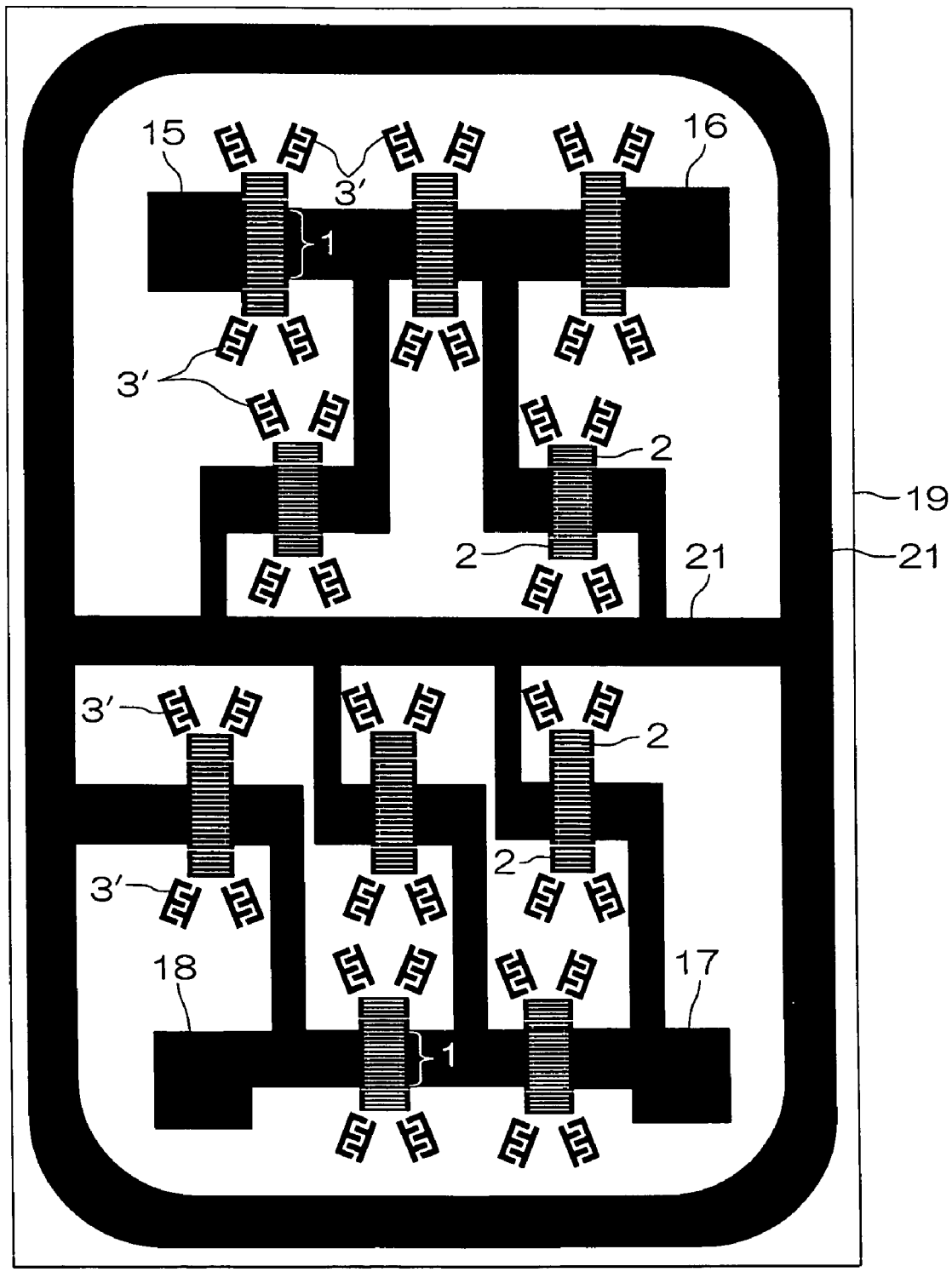
FIG. 12 is a schematic diagram of a surface acoustic wave duplexer as one example of surface acoustic wave devices according to the present invention.

A surface acoustic wave duplexer as a surface acoustic wave device according to the present invention can be constructed by forming two ladder-type filters, which are produced using a plurality of the surface acoustic wave resonators shown in FIG. 11 on a piezoelectric substrate 19. The structure thereof is shown in FIG. 12. This is different only in that, instead of the auxiliary reflector electrodes 3 in FIG. 1, the IDT-type auxiliary reflector electrodes 3' are used.

It is also possible to arrange the structure such that the pitch of the electrode fingers 13b of the IDT-type auxiliary reflector electrodes 3' differs from the pitch of the grating electrodes 14a of the reflector electrodes 2. This makes it possible to design the IDT-type auxiliary reflector electrodes 3' and reflective electrodes 2 so that they have high reflectivity for wavelengths different from each other. As a result, surface acoustic waves with wavelengths that fail to be reflected by the reflector electrodes 2 can be reflected efficiently by the IDT-type auxiliary reflector electrodes 3', which allows leakage of surface acoustic waves to the outside of the surface acoustic resonator to be further suppressed.

Another arrangement may be such that the pitch of the electrode fingers 13b of the IDT-type auxiliary reflector electrodes 3' is different from the pitch of the electrode fingers 13a of the IDT electrode 1. This makes it possible to suppress unwanted resonation between the IDT-type auxiliary reflector electrodes 3' and the IDT electrode 1, so that a surface acoustic wave resonator with low ripple can be realized.

In the case of the duplexer shown in FIG. 12, by designing the pitch of the electrode fingers 13b of the IDT-type auxiliary reflector electrodes 3' of the surface acoustic wave resonator used for the transmission filter so as to correspond to the pitch of the electrode fingers 13a of the IDT electrode 1 of the surface acoustic wave resonator used for the receiving filter, the isolation characteristics in the receiving frequency band can be improved. This is because surface acoustic waves with wavelengths in the receiving frequency band that fail to be reflected by the reflector electrodes 2 are reflected by the IDT-type auxiliary reflector electrodes 3' to be confined within the surface acoustic wave device, so that the surface acoustic waves are prevented from leaking from the surface acoustic wave resonators of the transmission filter to the receiving filter.

Furthermore, it may be arranged such that a plural number of different pitches are used for the electrode fingers 13b of the IDT-type auxiliary reflector electrodes 3'. By this arrangement, it is possible to suppress not only surface acoustic waves in a specific frequency band but also those in a wider frequency band that leak from the surface acoustic wave device and to thereby improve the Q of the surface acoustic wave resonator. In this case, the spatial arrangement of the plural number of pitches is not particularly important, but may be determined freely.

In addition, the configuration of the IDT-type auxiliary reflector electrode 3' may be formed by electrode fingers other than the linear-shaped electrode fingers, such as those having an arc shape with a certain curveture, an inflexed or curved shape, or trapezoidal shape. By the foregoing arrangement, leaking surface acoustic waves can be reflected at a wide range of angles, which leads to advantageous effects such as improved Q of resonators, improved insertion loss of filters and improved isolation characteristics of duplexers.

Also, in the IDT-type auxiliary reflector electrodes 3', it is possible to provide dummy electrodes 8 as in the case of the IDT electrode 1 shown in FIG. 11, or to carry out the so-called apodizing in which the lengths of the electrode fingers 13a and dummy electrodes 8 are varied according to the region. This allows leaking surface acoustic waves with a wider range of wavelengths to be reflected, and allows the reflectivity at a certain frequency to be improved. As a result, advantageous effects such as improved Q of resonators, improved insertion loss of filters and improved isolation characteristics of duplexers can be obtained.

Figure 13:
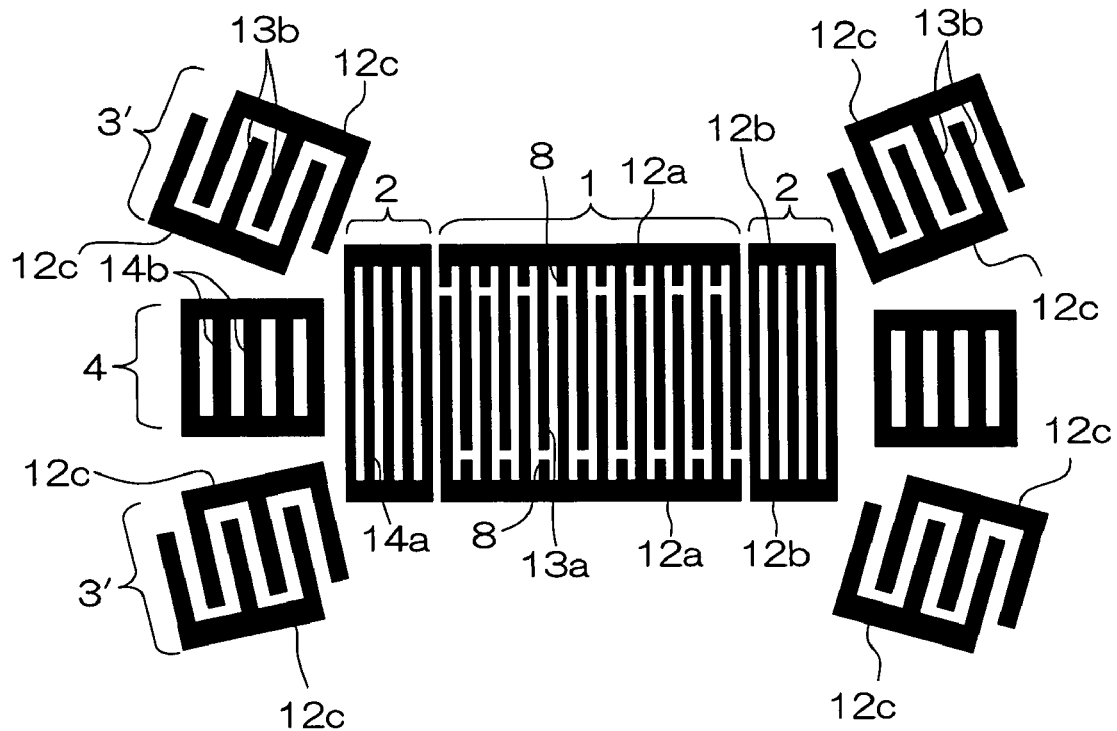
FIG. 13 is a plan view of still another embodiment of the surface acoustic wave resonator according to the present invention.

Also, it is possible to dispose second auxiliary reflector electrodes 4 between the two adjacent IDT-type auxiliary reflector electrodes 3', in other words, to be external to the both outer sides of the reflector electrodes 2. FIG. 13 shows an example of the arrangement of the second auxiliary reflector electrodes 4.

By these second auxiliary reflector electrodes 4, surface acoustic waves that propagate in a direction generally perpendicular to the electrode fingers 13a of the IDT electrode 1 and fail to be reflected by the reflector electrodes 2 can be reflected.

Incidentally, as already described referring to FIG. 5, when the second auxiliary reflector electrodes 4 comprise grating electrodes 14b, the pitch thereof may be different from that of the grating electrodes 14a of the reflector electrodes 2, they may comprise IDT electrodes (IDT-type reflectors) or only grating electrodes (open reflectors), and they may be arranged with a plural number of different pitches.

Also, the IDT-type auxiliary reflector electrodes 3' and the second auxiliary reflector electrode 4 adjacent to each other may be connected together to form a unitary piece.

Figure 14:
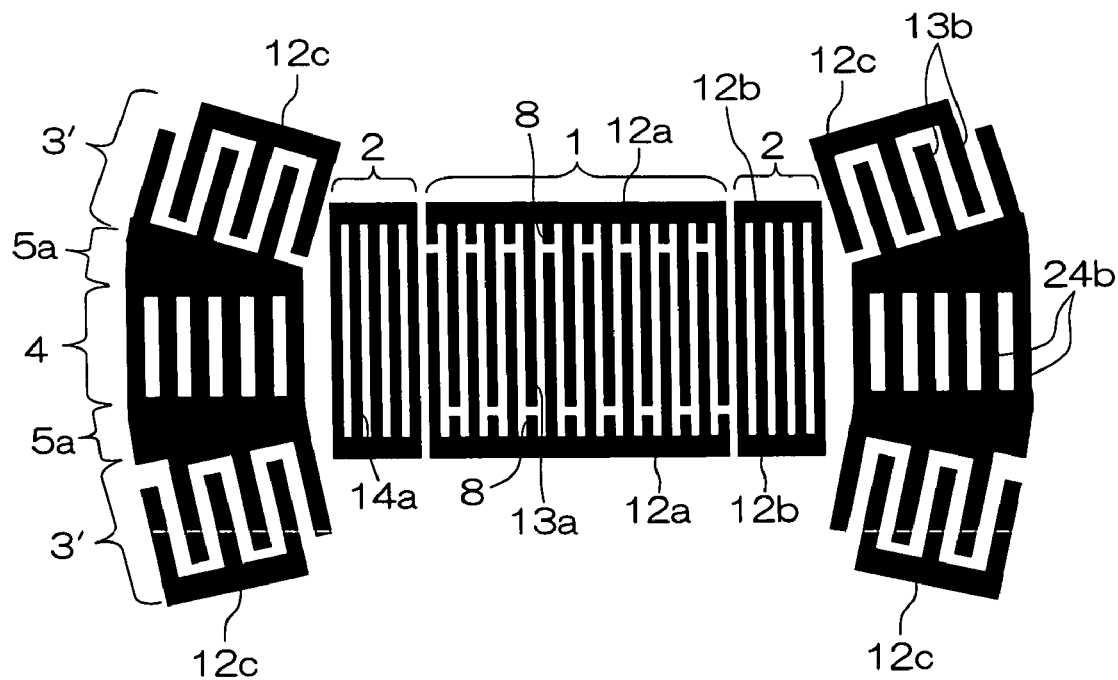
FIG. 14 is a plan view of still another embodiment of the surface acoustic wave resonator according to the present invention.

For example, as shown in FIG. 14, they may be connected by providing connecting sections 5a in regions formed by extending the bus bar electrodes of the IDT-type auxiliary reflector electrodes 3' and the bus bar electrodes of the second auxiliary reflector electrodes 4 as they are.

Figure 15:
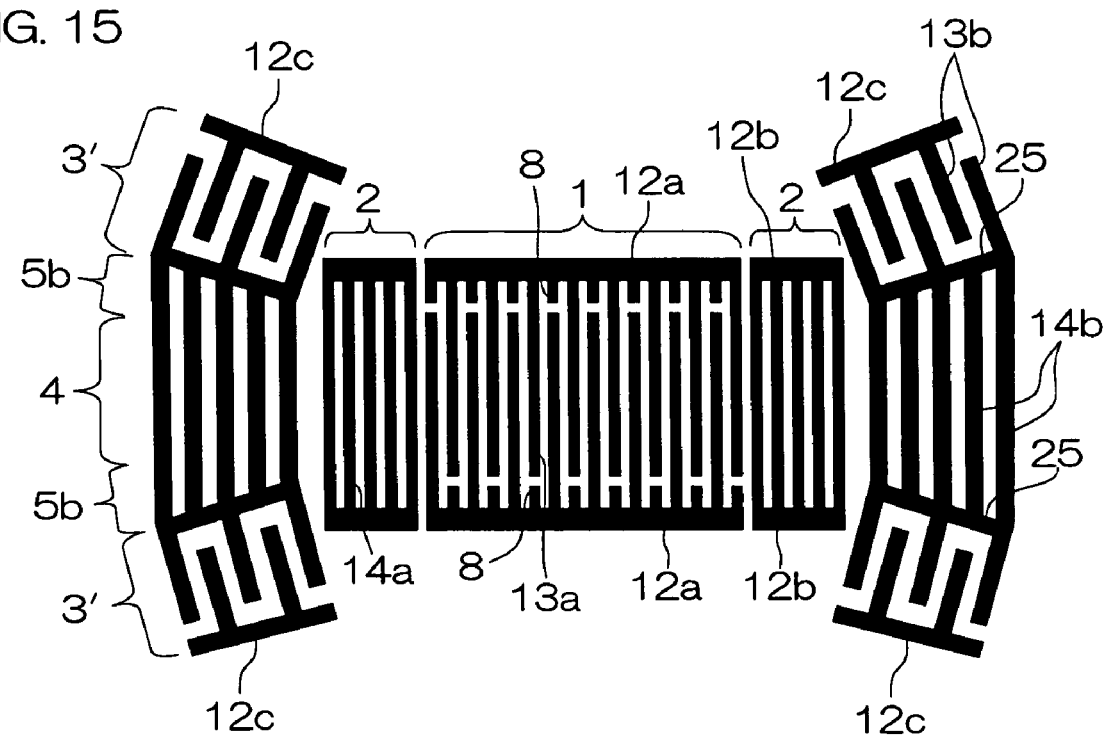
FIG. 15 is a plan view of still another embodiment of the surface acoustic wave resonator according to the present invention.
Figure 16:
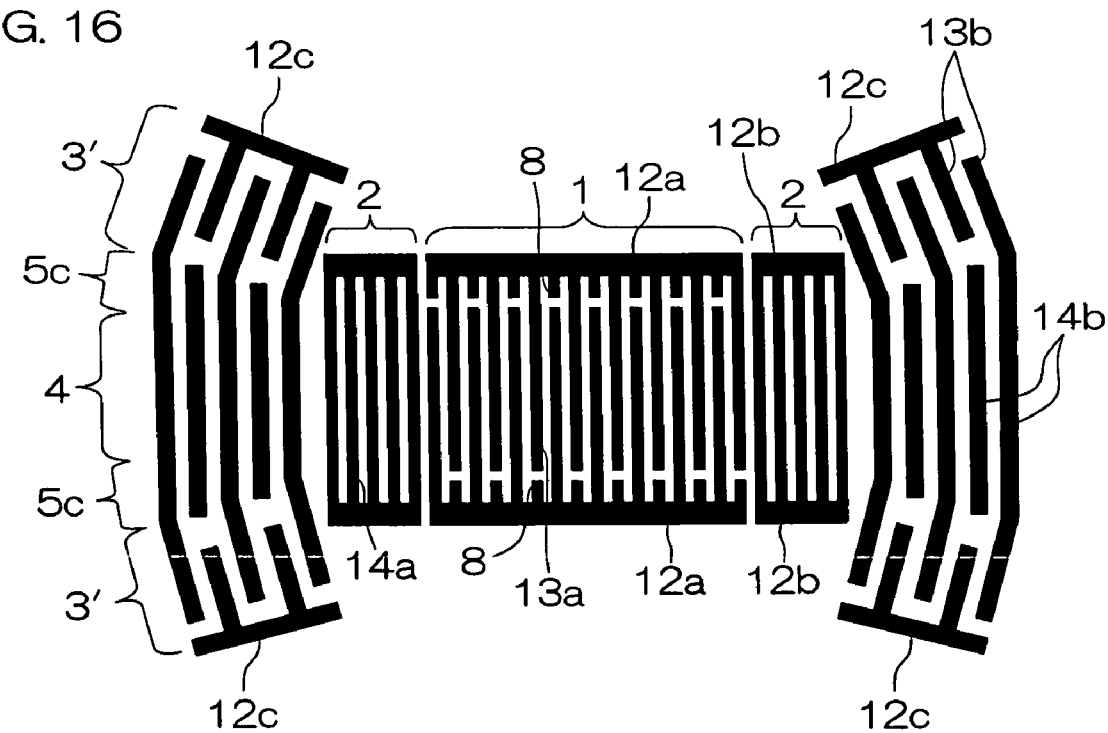
FIG. 16 is a plan view of still another embodiment of the surface acoustic wave resonator according to the present invention.

As shown in FIG. 15, it is possible to provide sections 5b formed by extending the grating electrodes 14b of the second auxiliary reflector electrode 4 until they come in contact with the grating electrodes 13b of the IDT-type auxiliary reflector electrodes 3' so as to form a unitary piece. In that case, bus bar electrodes 25 for short-circuiting the grating electrodes 14b may be provided or not provided as in the case shown in FIG. 16.

Figure 17:
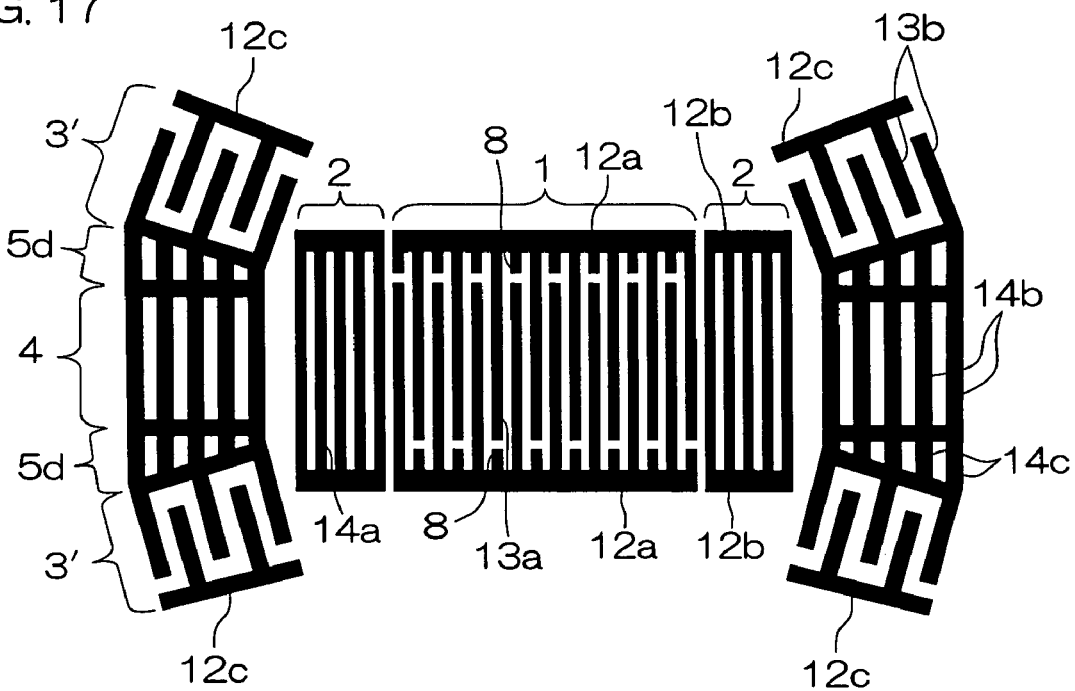
FIG. 17 is a plan view of still another embodiment of the surface acoustic wave resonator according to the present invention.

Also, the structure may be such that, as shown in FIG. 17, grating electrode 14c are further provided in regions 5d which corresponds to the spaces between the IDT-type auxiliary reflector electrodes 3' and the second auxiliary reflector electrodes 4 in FIG. 13. Or, instead of the grating electrodes 14c, IDT electrodes may be provided.

By the arrangement described above, surface acoustic waves that leak between the IDT-type auxiliary reflector electrodes 3' and the second auxiliary reflector electrodes 4 in FIG. 13 can be reflected to be confined within the surface acoustic wave resonator, thereby realizing a surface acoustic wave resonator with further improved Q.

Among the foregoing structures, the structures shown in FIGS. 15 and 17 are particularly advantageous because they allow the pitches of the grating electrodes to be optimum in various directions.

In addition, the configuration of the second auxiliary reflector electrode 4 may be formed by electrode fingers other than linear-shaped electrode fingers, such as those having an arc shape with a certain curvature, an inflexed or curved shape, or trapezoidal shape. By the foregoing arrangement, leaking surface acoustic waves can be reflected at a wide range of angles, which leads to advantageous effects such as improved Q of resonators, improved insertion loss of filters and improved isolation characteristics of duplexers.

Alternatively, instead of the reflector electrodes 2 with a geometry of a rectangular parallelepiped shown in FIG. 11, reflector electrodes each having a configuration in which the grating electrodes 14a of the reflector electrode have inflexed end portions so that the bus bar electrodes 12b of the reflector electrode 2 are inclined toward the IDT electrode 1 may be used as in the case shown in FIG. 10.

Since the surface acoustic wave resonators or surface acoustic wave devices according to the present invention described so far have good insertion loss characteristics within the pass band, they can be applied to communications equipments.

That is, in a communications equipment comprising one or both of receiving circuit and transmission circuit, a surface acoustic wave resonator or surface acoustic wave device according to the present invention can be incorporated in a band pass filter and a duplexer.

The above-mentioned transmission circuit is a circuit in which a transmission signal is mixed with a carrier frequency by a mixer and unwanted signals are attenuated by a band pass filter, and thereafter the transmission signal is amplified by a power amplifier and passes through a duplexer to be transmitted from an antenna.

The above-mentioned receiving circuit is a circuit in which a receiving signal is received by an antenna and passes through a duplexer, which is amplified by a low noise amplifier, and thereafter unwanted signals are attenuated by a band pass filter, and the signal is then separated from the carrier frequency by a mixer to be outputted.

The communications equipment incorporating the foregoing duplexer and band pass filter is capable of reducing input power required for attaining the same output power because of the low insertion loss filter. For this reason, power consumption of the power amplifier can be reduced, thereby realizing a communications equipment with low power consumption.

In addition, when the surface acoustic wave duplexer of the present invention which comprises a transmission filter section and receiving filter section on a piezoelectric substrate is used, because of the small size of the surface acoustic wave duplexer, the mounting area for other components can be secured, so that a communications equipment with small size and high functionality can be realized. In addition, because of the high isolation characteristics, high speech quality can be achieved.

It should be understood that modes of implementation of the present invention are not limited to the foregoing embodiments, but various modifications may be made without departing from the scope and spirit of the present invention.

Figure 18:
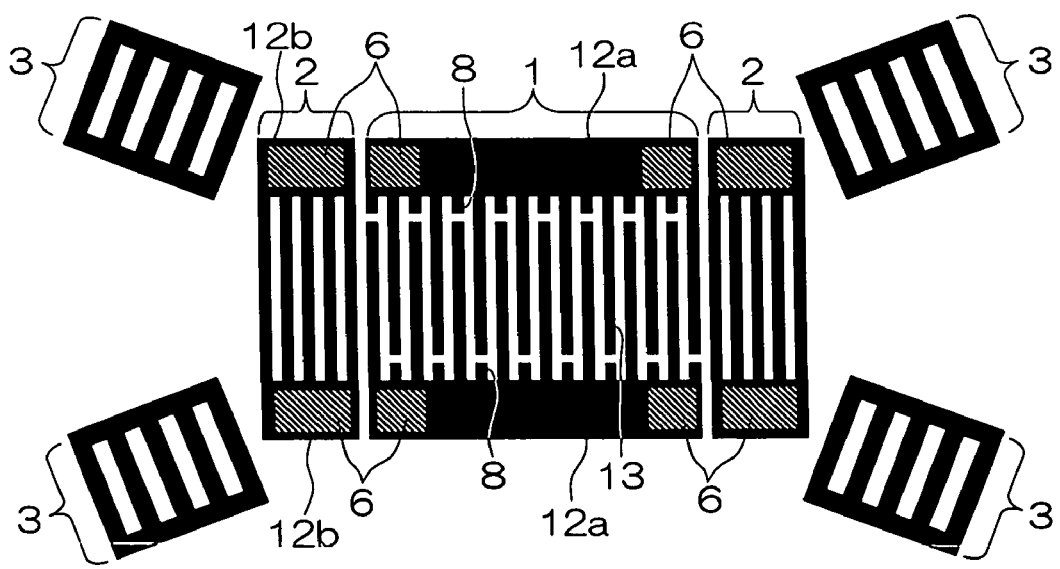
FIG. 18 is a plan view of still another embodiment of the surface acoustic wave resonator according to the present invention.

For example, as shown in FIG. 18, thick film sections 6 may be further provided on bus bar electrodes 12a and bus bar electrodes 12b of the reflector electrodes 2. This can suppress coupling between the mode of main propagation path and the mode of the bus bar electrodes, losses due to leakage of surface acoustic waves can therefore be suppressed. While a configuration where thick film sections 6 are provided in a vertically symmetrical manner with electrode fingers 13 and grating electrodes of the reflector electrodes 2 interposed in between is shown in FIG. 18, other configurations that are not vertically symmetrical may also be possible.

In addition, the geometry of the IDT electrode may be other than a rectangle as shown in FIGS. 1 and 11. It may be an apodized electrode having a triangular, rhombic, or trapezoidal shape or the like.

Also, the geometries of the regions of the grating electrodes of reflector electrodes may be triangular, rhombic, trapezoidal and the like.

Regarding the locations of the auxiliary reflector electrodes, they may be located on virtual straight lines laterally extending from the bus bar electrodes of the reflector electrodes in the direction opposite to the sides on which the second reflector electrodes are adjacent to the IDT electrode. Although effective angles θ of inclination would be greater than 0° and not greater than 20°, since an effective angle is a parameter dependant on the substrate orientation, the film thickness of the IDT electrode, the pitch of the electrode fingers 13, they are not limited to this range.

While the cases of a ladder-type filter are described here, the present invention is applicable to other types of surface acoustic wave devices dealing with surface acoustic waves including DMS-type filters, transversal-type filters, IIDT-type filters and the like.

EXAMPLES

First, a four-layer conductive base film comprising Ti/Al-1 wt % Cu/Ti/Al-1 wt % Cu in order from the substrate side was deposited by sputtering on one principal surface of a piezoelectric substrate comprising a 38.7 degree Y-cut X-propagation single crystal lithium tantalite substrate with a thickness of 250 µm. The thicknesses of the layers were 6 nm/104 nm/6 nm/104 nm, respectively.

Then, the conductive base film was patterned by photolithography and the RIE process to produce surface acoustic wave duplexers according to the present invention shown in FIGS. 2 and 12, each of which comprises a plurality of surface acoustic wave resonators each including an IDT electrode with electrode fingers and bus bar electrodes, reflector electrodes, auxiliary reflector electrodes and input and output electrodes, in which the surface acoustic wave resonators are connected to one another in a ladder-like configuration. The gas used for the etching was a mixture of $BCl_3$ and $Cl_2$. The width of the electrode fingers and the distance between adjacent electrode fingers were both about 0.5 µm.

Figure 19:
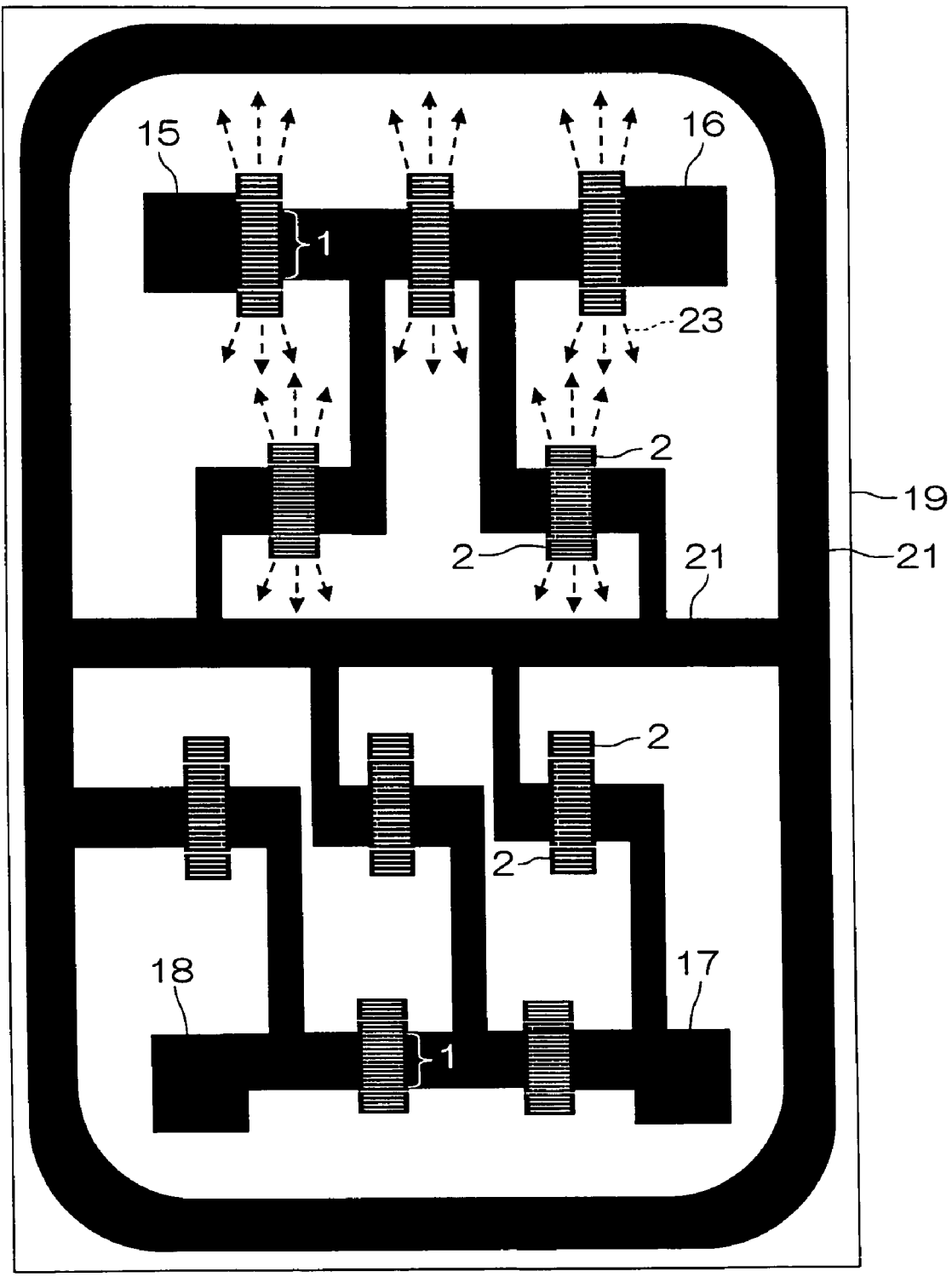
FIG. 19 is a schematic diagram of a conventional surface acoustic wave duplexer viewed from top.

In addition, as a comparative example of a conventional structure, a surface acoustic wave duplexer with the structure shown in FIG. 19 was produced at the same time.

Subsequently, additional conductive layers comprising Cr/ni/Au were deposited on the input terminals 15, 17, output terminals 16, 18, and the annular conductors 21, and input pads and output pads were formed on the input terminals 15, 17 and output terminals 16, 18, respectively.

The thicknesses of the additional conductive layers were 10 nm/1000 nm/100 nm, respectively. The piezoelectric substrate was then subjected to dicing processing along a dicing line, and was divided for each chip of the surface acoustic wave duplexer.

Subsequently, the surface acoustic wave duplexer of the example of the present invention and the surface acoustic wave duplexer of the comparative example were respectively mounted on a packaging base comprising an LTCC (Low Temperature Co-fired Ceramics) substrate with one principal surfaces thereof opposed thereto.

The LTCC substrate mentioned here comprises base side annular conductors corresponding to the annular conductors 21 formed on one principal surface of the piezoelectric substrate 19, and pad electrodes to be connected to the input and output pads of the surface acoustic wave duplexer, and a solder was printed on these base side annular conductors and pad electrodes preliminarily.

In mounting the surface acoustic wave duplexers on the LTCC substrate, the surface acoustic wave duplexers were each disposed so as to match the solder patterns, and tentatively secured by application of ultrasonic waves, and then heated to melt the solder so that the annular conductors 21 and the base side annular conductors, and input and output pads and pad electrodes were connected together, respectively.

Through this process, the IDT electrodes, reflector electrodes and input and output pads of each of the surface acoustic wave duplexers were completely hermetically sealed by the base side annular conductors and the annular conductors 21 connected thereto.

Incidentally, the process of mounting the surface acoustic wave devices described so far was carried out in an nitrogen atmosphere.

Subsequently, the other principal surfaces (backside surfaces) of the surface acoustic devices were protected by a molding resin, and in the last step, the LTCC substrate was diced between the surface acoustic wave duplexers. As a result, a surface acoustic wave device comprising a surface acoustic wave duplexer according to the example of the present invention and that comprising a surface acoustic wave duplexer according to the comparative example were obtained.

(1) In the Case of a Device Having the Auxiliary Reflector Electrodes 3 (FIG. 2)

Figure 20:
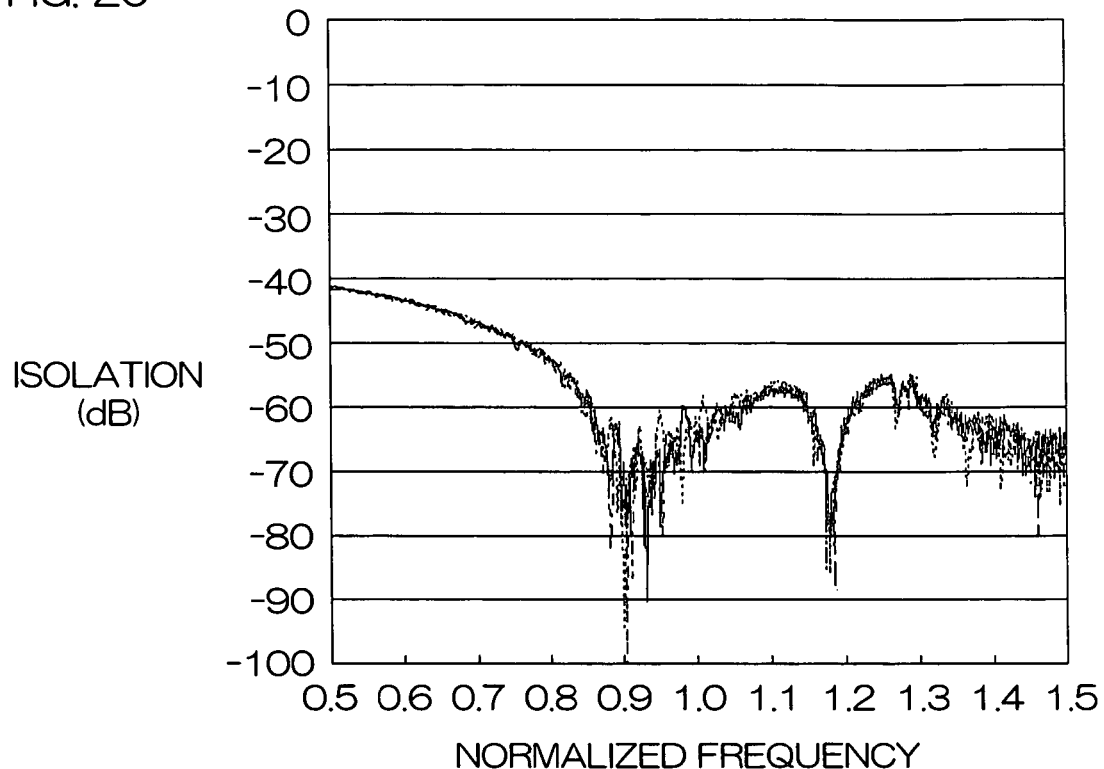
FIG. 20 is a graph showing an isolation characteristic of a surface acoustic wave duplexer produced in Examples of the present invention.

FIG. 20 is a graph showing isolation characteristics of duplexers having the structure of FIG. 2.

In FIG. 20, the horizontal axis indicates normalized frequency and the vertical axis indicates isolation (unit:dB) The dotted characteristic curve shows the result of the conventional surface acoustic wave duplexer without the auxiliary reflector electrodes shown in FIG. 19, and the solid characteristic line shows the result of the example of the present invention including auxiliary reflector electrodes 3 added to the conventional surface acoustic wave duplexer.

It is apparent from the results shown in FIG. 20 that a great improvement in isolation characteristic was observed in the surface acoustic wave duplexer of the present invention as compared with that of the comparative example, for example, a maximum difference of 5 dB at a normalized frequency of 0.95.

It is believed that the reason that the surface acoustic wave duplexer of the comparative example failed to exhibit a good characteristic is due to existence of propagating surface acoustic waves that leaked from the surface acoustic wave resonators constituting the transmission filter.

Figure 21:
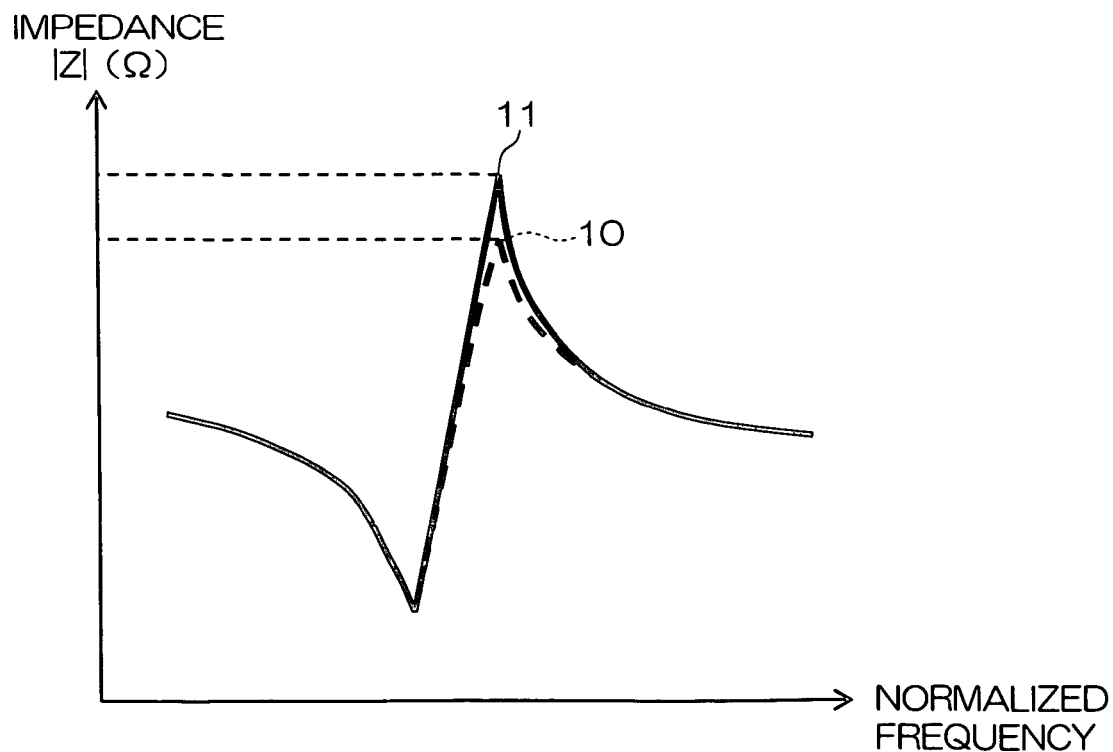
FIG. 21 is a graph showing an impedance characteristic of a surface acoustic wave resonator for illustrating an effect of the present invention.

FIG. 21 is a graph showing a comparison between an impedance characteristic (solid line) of a one terminal-pair surface acoustic wave resonator produced using a surface acoustic wave resonator of the present invention and an impedance characteristic (broken line) exhibited by a conventional surface acoustic wave resonator.

In FIG. 21, the horizontal axis indicates frequency normalized by an arbitrary frequency, and the vertical axis indicates absolute value |Z| (unit:Ω) of impedance. The peak of impedance |Z| is called "antiresonance resistance".

As shown in FIG. 21, the peak value called the antiresonance resistance 11 can be increased by the present invention, thereby achieving a high Q. The antiresonance resistance 11 is a parameter which, when a ladder-type filter is produced, influences insertion loss within the pass band. The greater the antiresonance resistance 11 of parallel surface acoustic wave resonators of the ladder-type filter, the greater the reduction of insertion loss. Specifically, while the antiresonance resistance 11 of the resonator of the present invention is about 900Ω, the antiresonance resistance 10 of the conventional resonator without having auxiliary reflector electrodes 3 is 840Ω. The antiresonance resistance is greatly improved by about 60Ω by the present invention.

Figure 22:
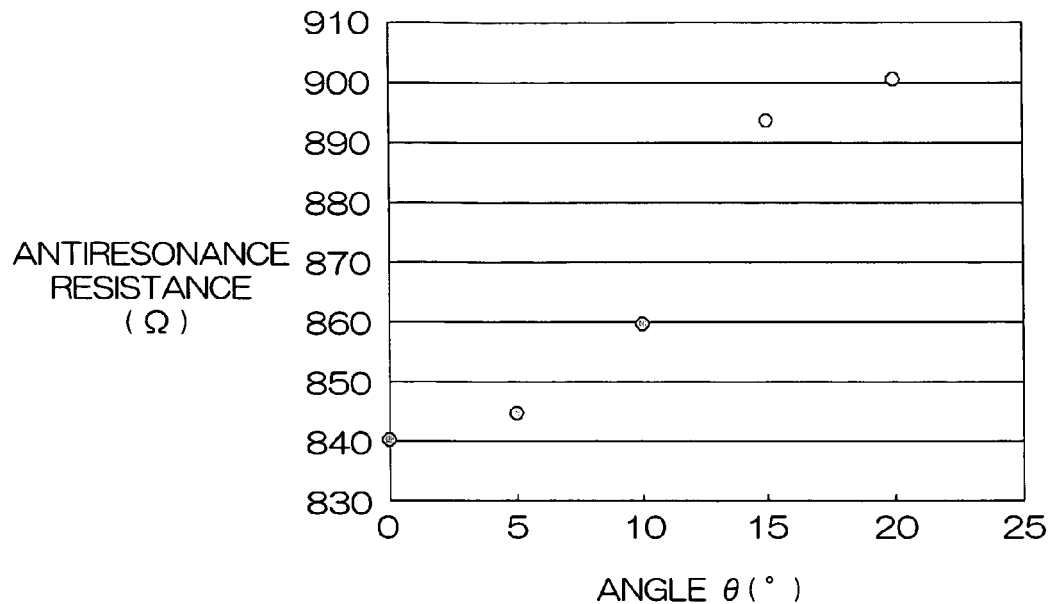
FIG. 22 is a graph showing antiresonance resistance of a surface acoustic wave resonator produced in Examples of the present invention.

FIG. 22 is a graph showing angle θ (unit: degree) made by the periodic direction G of grating electrodes 14b of auxiliary reflector electrode 3 and the main propagation direction F of surface acoustic waves at IDT electrode 1 along the horizontal axis, and antiresonance resistance (unit:Ω) along the vertical axis.

This experiment revealed that the antiresonance resistance is improved by about 62Ω by varying θ from 0° to 20°.

Meanwhile, the angle made by the direction G of the auxiliary reflector electrodes 3 and the main propagation direction F of surface acoustic waves at the IDT electrode 1 may be 20° or greater according to the desired characteristic.

Figure 23:
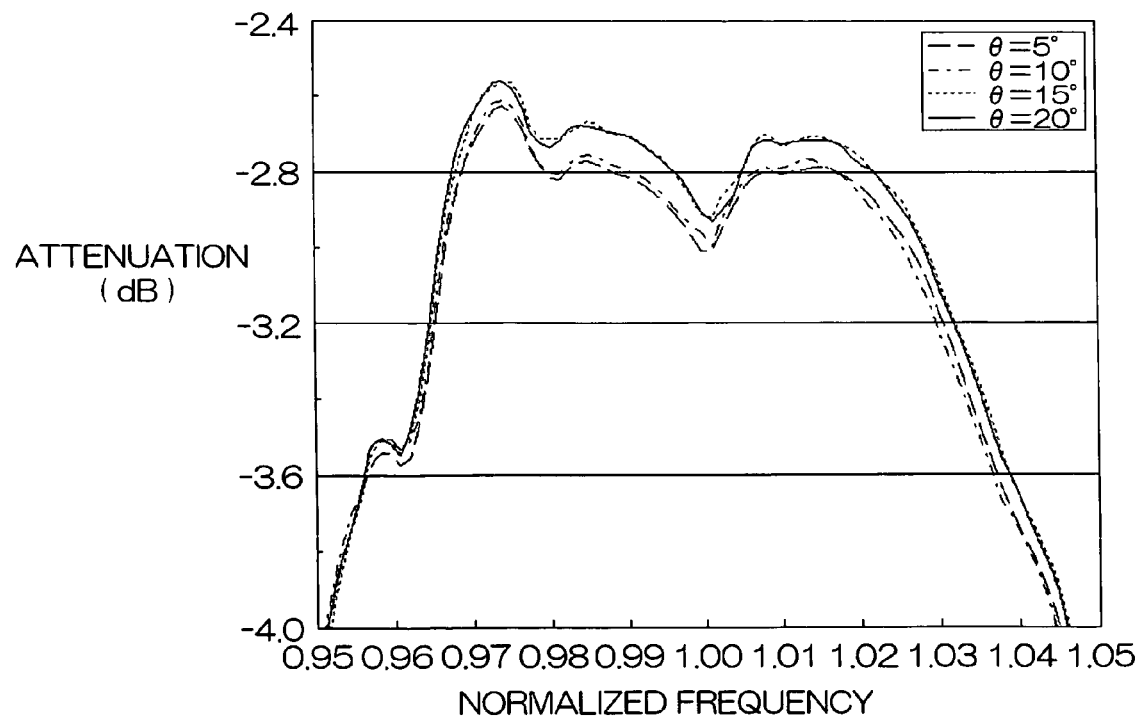
FIG. 23 is a graph showing a pass band characteristic of a surface acoustic wave duplexer produced in Examples of the present invention.

FIG. 23 is an enlarged graph of a characteristic of a transmission filter within the pass band. In FIG. 23, the horizontal axis indicates frequency normalized by an arbitrary frequency, and the vertical axis indicates attenuation (unit:dB).

Angle θ (unit: degree) made by the direction G of the auxiliary reflector electrodes 3 and the main propagation direction F of surface acoustic waves at the IDT electrode 1 is used as a parameter, where the broken line, dash-dotted line, dotted line and solid line indicate 5°, 10°, 15° and 20°, respectively. FIG. 23 shows that the improvement in insertion loss is greatest when θ is 20°, which is about 0.1 dB higher than when θ is 5°.

In addition, by exactly the same process as that described in the example above, a surface acoustic wave duplexer using surface acoustic wave resonators of the present invention was produced, in which the pitch of the grating electrodes 14b of the auxiliary reflector electrodes 3 was made different from the pitch of the electrode fingers 13a of the IDT electrode 1. The results are shown in FIG. 24.

Figure 24:
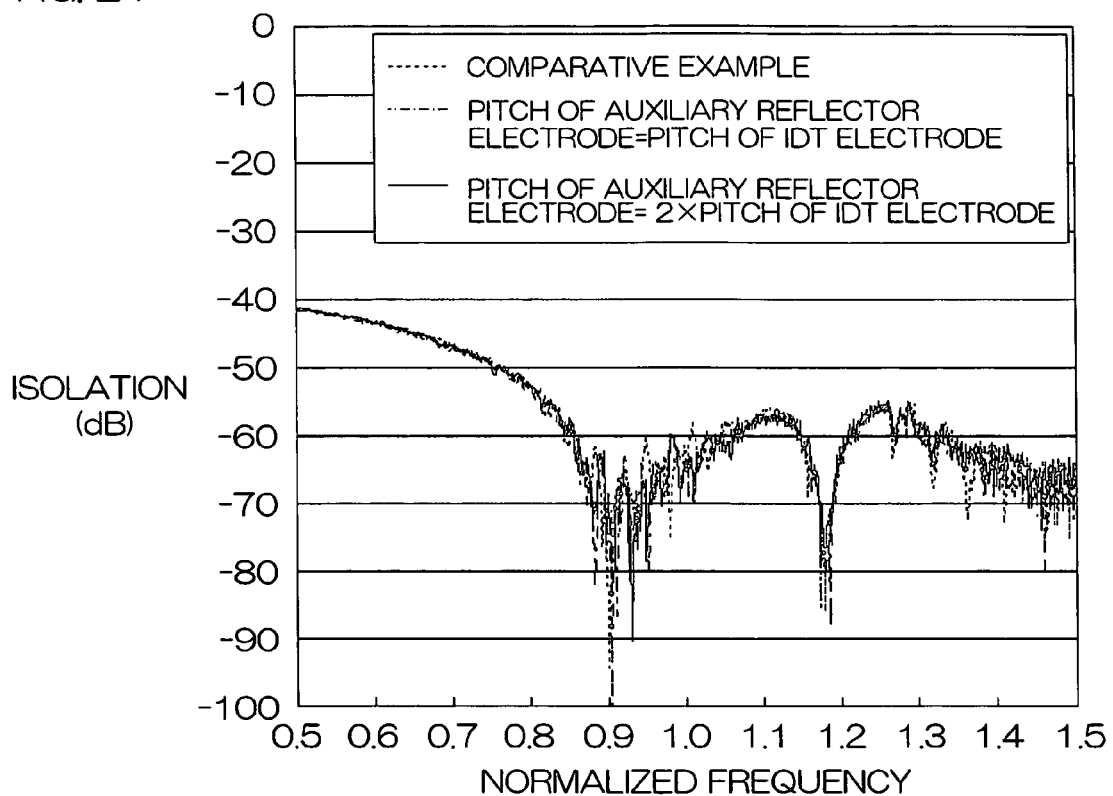
FIG. 24 is a graph showing an isolation characteristic of a surface acoustic wave duplexer produced in Examples of the present invention.

FIG. 24 is a graph showing the isolation characteristic in the case of a structure whose schematic diagram viewed from top is the same as FIG. 2, where the pitch of the grating electrodes 14b of the auxiliary reflector electrodes 3 was made different from the pitch of the electrode fingers 13a of the IDT electrode 1.

In the graph of FIG. 24, the horizontal axis indicates normalized frequency, and the vertical axis indicates isolation (unit:dB). The dotted characteristic curve shows the result obtained on the comparative example without having auxiliary reflector electrodes 3, and the broken line and the solid line respectively show the results of the example of the present invention in the following cases where: 1) auxiliary reflector electrodes 3 are provided in which the pitch of the grating electrodes 14b is the same as the pitch of the electrode fingers 13a of the IDT electrode 1; 2) auxiliary reflector electrodes 3 are provided, in which the pitch of the grating electrodes 14b is twice as large as the pitch of the electrode fingers 13a of the IDT electrode 1.

It is apparent from the results shown in FIG. 24 that the isolation characteristic of the surface acoustic wave resonator of this example is greatly improved by about 6 dB at the maximum as compared with the comparative example.

(2) In the Case of a Device Having IDT-Type Auxiliary Reflector Electrodes 3' (FIG. 12)

Figure 25:
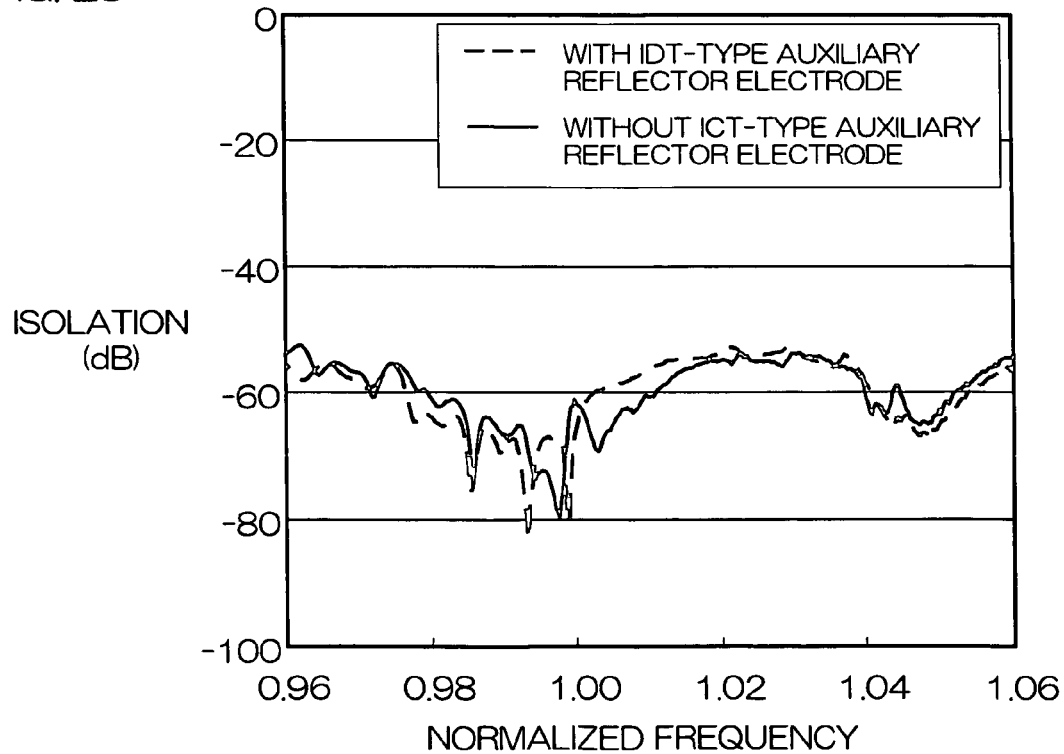
FIG. 25 is a graph showing an isolation characteristic of a surface acoustic wave duplexer produced in Examples of the present invention.

Isolation characteristics of devices produced as example of the present invention and comparative example are shown in FIG. 25.

In FIG. 25, the horizontal axis indicates normalized frequency, and the vertical axis indicates isolation (unit: dB). The broken line shows the result of the comparative example without having IDT-type auxiliary reflector electrodes 3' shown in FIG. 19, and the solid line shows the result of the example of the present invention including IDT-type auxiliary reflector electrodes 3' added to the conventional surface acoustic wave duplexer.

As the results in FIG. 25 show, the surface acoustic wave duplexer of this example has a greatly improved isolation characteristic, which is, for example, greater than that of the comparative example by about 9 dB at a normalized frequency of 1.005. It is believed that the reason that the surface acoustic wave duplexer of the comparative example failed to exhibit a good characteristic is due to existence of propagating surface acoustic waves that leaked from the surface acoustic wave resonators constituting the transmission filter.

Figure 26:
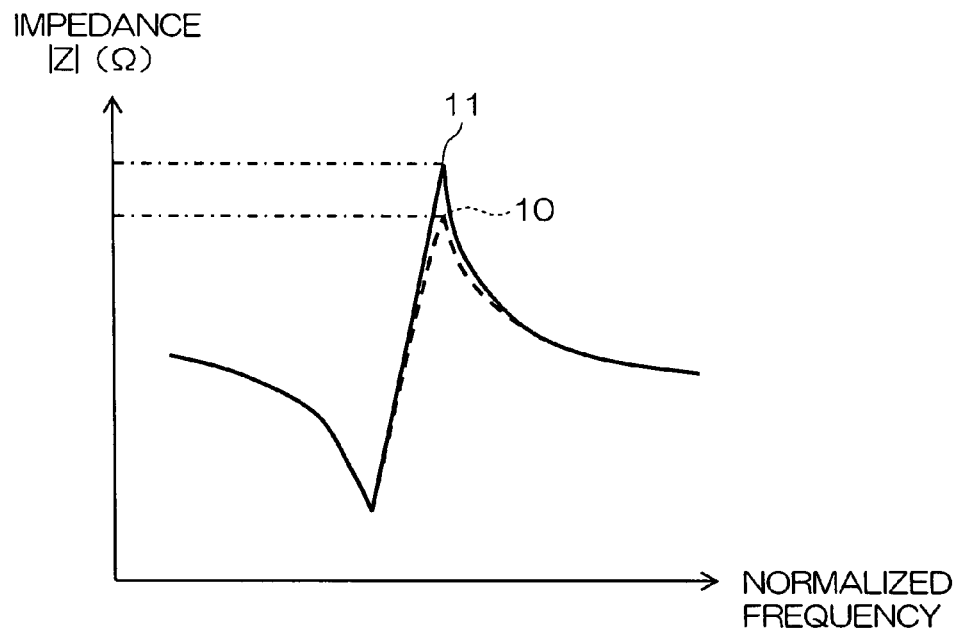
FIG. 26 is a graph showing an impedance characteristic of a surface acoustic wave resonator produced in Examples of the present invention.

The graph in FIG. 26 shows the results of a comparison between the impedance characteristic (solid line) of a one terminal-pair surface acoustic wave resonator produced by using the surface acoustic wave resonator of the present invention and the impedance characteristic (broken line) of the conventional surface acoustic wave resonator. As the solid line shows, it is apparent that the peak value called antiresonance resistance 11 can be increased. Specifically, the antiresonance resistance 11 of the resonator of the present invention is about 819Ω, while the antiresonance resistance 10 of the conventional surface acoustic wave resonator without including the IDT-type auxiliary reflector electrodes 3' is 812Ω, which shows that it can be improved by about 7Ω by the present invention.

Figure 27:
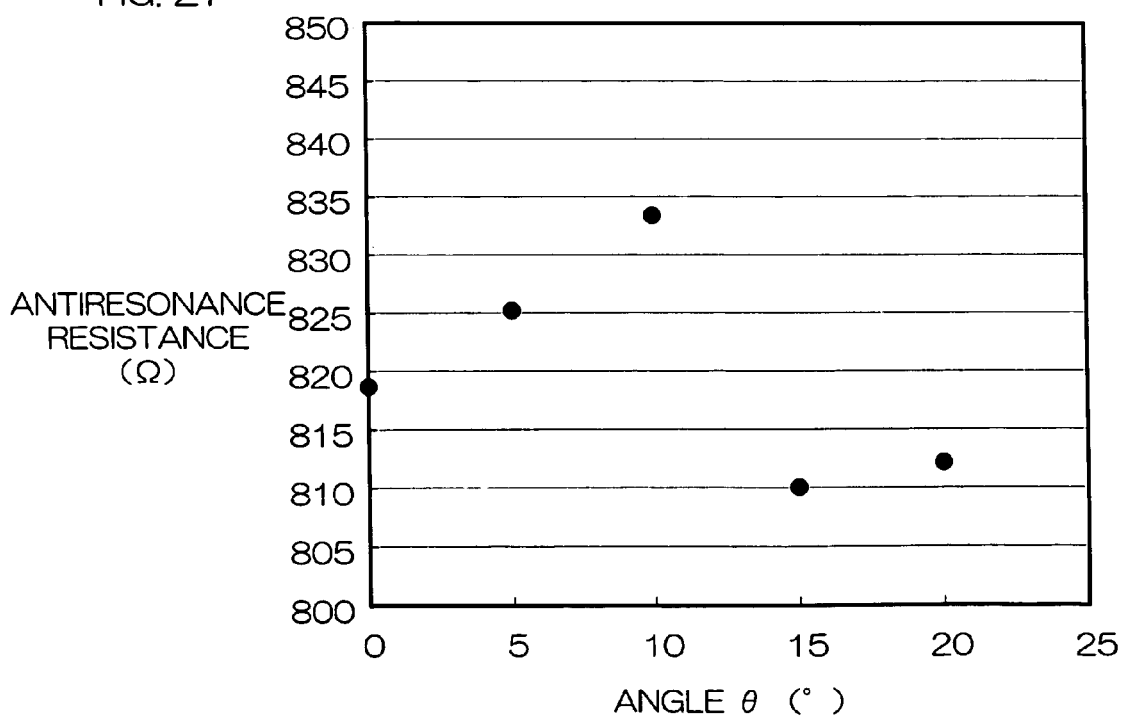
FIG. 27 is a graph showing antiresonance resistance of a surface acoustic wave resonator produced in Examples of the present invention.

FIG. 27 is a graph showing angle θ made by the direction G of the IDT-type auxiliary reflector electrodes 3' and the main propagation direction F of surface acoustic waves at the IDT electrode 1 along the horizontal axis, and antiresonance resistance (unit:Ω) along the vertical axis.

This experiment revealed that the antiresonance resistance is improved by about 14Ω by varying θ from 0° to 10°. Incidentally, the greatest improvement is observed when θ is around 10°.

Accordingly, for the purpose of obtaining the optimum antiresonance resistance, the angle θ made by the direction G of the IDT-type auxiliary reflectors and the main propagation direction F of surface acoustic waves at the IDT electrode 1 is preferably from 5° to 10°.

By the way, when this angle θ is greater than 10°, the value of antiresonance resistance is small. However, as will be later described referring to FIG. 29, the isolation characteristic is improved irrespective of the angle.

Figure 28:
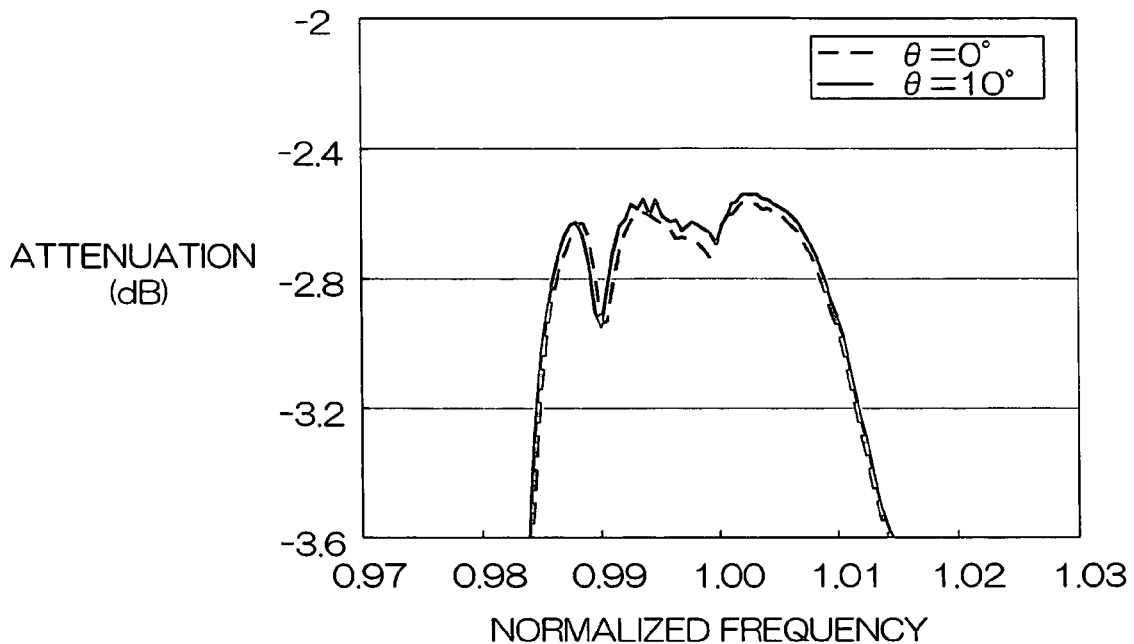
FIG. 28 is a graph showing a pass band characteristic of a surface acoustic wave duplexer produced in Examples of the present invention.

FIG. 28 is an enlarged graph showing a characteristic within the pass band of the transmission filter of the duplexer shown in FIG. 12.

In FIG. 28, the horizontal axis indicates frequency normalized by an arbitrary frequency, and the vertical axis indicates attenuation (unit:dB).

Angle θ (unit: degree) is used as the parameter, where the broken line is for θ=0°, and the solid line is for θ=10°. FIG. 28 shows that the insertion loss is improved by about 0.1 dB at θ=10° as compared with the conventional case.

Figure 29:
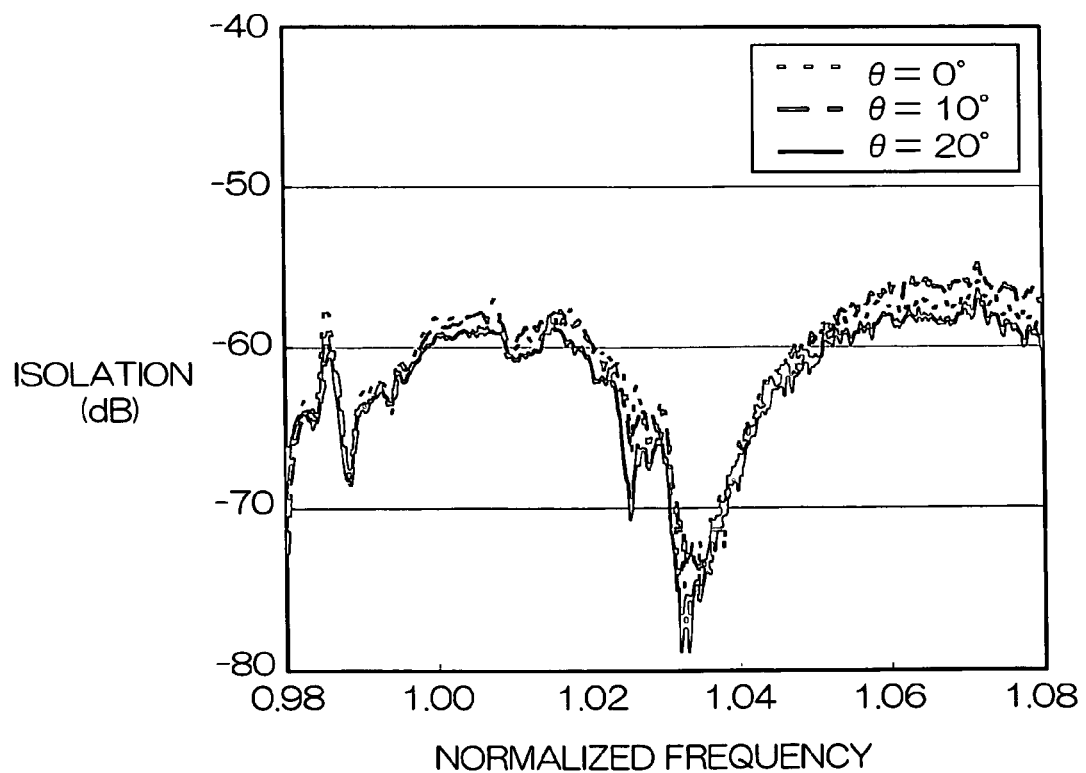
FIG. 29 is a graph showing an isolation characteristic of a surface acoustic wave duplexer produced in Examples of the present invention.

Influence on isolation characteristic by varying the angle of inclination θ of the IDT-type auxiliary reflectors which are disposed on virtual straight lines extending from the bus bar electrodes in the direction opposite to the sides on which the reflector electrodes are adjacent to the IDT electrode is shown as the graph in FIG. 29.

Angle θ (unit: degree) is used as the parameter, and the horizontal axis indicates frequency normalized and the vertical axis indicates isolation (unit:dB).

As the angle of inclination θ of the IDT-type auxiliary reflectors increases in the range of 0° to 20°, the isolation characteristic is improved in a wide frequency range. A maximum improvement of about 2 dB is observed when θ=20° as compared with when θ=0°.

In addition, by the exactly same process as used in the example described above, a surface acoustic wave duplexer in which the pitch of the electrode fingers 13b of the IDT-type auxiliary reflector electrodes 3' is different from the pitch of the electrode fingers 13a of the IDT electrodes 1 was produced, and the foregoing evaluation was conducted.

Figure 30:
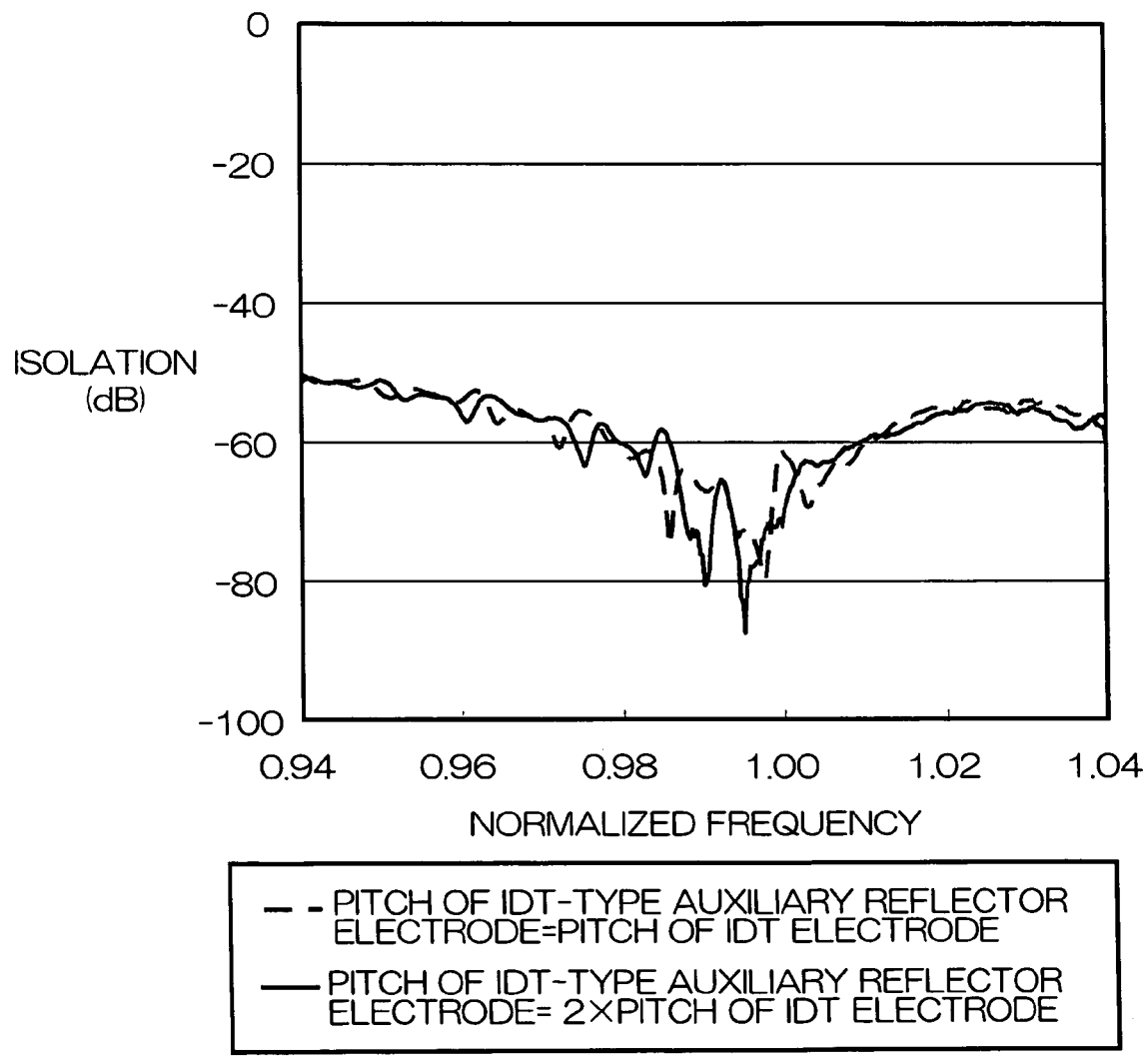
FIG. 30 is a graph showing an isolation characteristic of a surface acoustic wave duplexer produced in Examples of the present invention.

As seen in the results shown in FIG. 30, the isolation characteristic is improved by about 9 dB at a frequency of 1.00 within the pass band of the transmission filter when the pitch of the electrode fingers 13b of the IDT-type auxiliary reflector electrodes 3' is twice as large as the pitch of the electrode fingers 13a of the IDT electrodes 1.

Figure 31:
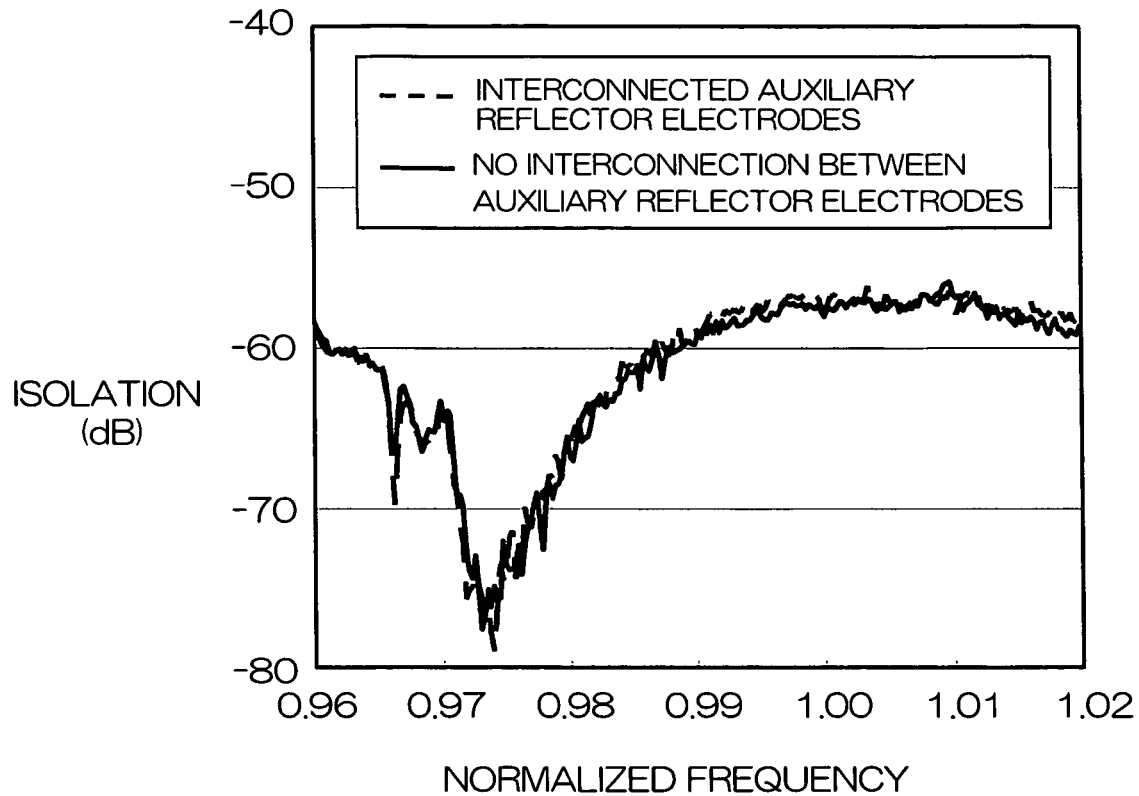
FIG. 31 is a graph showing an isolation characteristic of a surface acoustic wave duplexer produced in Examples of the present invention.

FIG. 31 is a graph showing isolation characteristic of a duplexer in which IDT-type auxiliary reflector electrodes 3' and second auxiliary reflector electrode 4 are connected together to form a unitary piece as shown in FIG. 14. The broken line shows the isolation of the structure in which IDT-type auxiliary reflector electrodes 3' and second auxiliary reflector electrodes 4 are not connected as in FIG. 13, and the solid line shows the isolation of the structure in which IDT-type auxiliary reflector electrodes 3' and second auxiliary reflector electrodes 4 are connected together as shown in FIG. 14. The solid line shows that isolation is improved by about 1 dB over a wide normalized frequency range of 0.98-

1.02 as compared with the case without the interconnection between auxiliary reflector electrodes.

The invention claimed is:

1. A surface acoustic wave resonator comprising:
a piezoelectric substrate;
an IDT electrode on the piezoelectric substrate, including a bus bar electrode substantially in parallel to a direction along which a surface acoustic wave propagates;
reflector electrodes on the piezoelectric substrate, adjacent to both sides of the IDT electrode in the direction; and
an auxiliary reflector electrode on the piezoelectric substrate, including a plurality of grating electrodes and disposed on a virtual straight line extending from the bus bar electrode of the IDT electrode, the auxiliary reflector electrode being more distant from the IDT electrode than the reflector electrode.

2. A surface acoustic wave resonator according to claim 1, wherein the auxiliary reflector electrode is formed such that the periodic direction of the periodically arranged electrodes is oriented toward the IDT electrode.

3. A surface acoustic wave resonator according to claim 1, wherein an angle θ made by the periodic direction of the periodically arranged electrodes of the auxiliary reflector electrode and the periodic direction of electrode fingers of the IDT electrode is greater than 0° and not greater than 20°.

4. A surface acoustic wave resonator according to claim 1, wherein the auxiliary reflector electrodes are disposed at four positions obliquely outside the reflector electrodes.

5. A surface acoustic wave resonator according to claim 4, wherein a second auxiliary reflector electrode is formed between two auxiliary reflector electrodes formed at positions external to the reflector electrodes.

6. A surface acoustic wave resonator according to claim 5, wherein the second auxiliary reflector electrode and the auxiliary reflector electrode are connected together to form a unitary piece.

7. A surface acoustic wave resonator according to claim 1, wherein both end portions of the periodically arranged electrodes of the auxiliary reflector electrode are short-circuited.

8. A surface acoustic wave resonator according to claim 1, wherein one end portions of the periodically arranged electrodes of the auxiliary reflector electrode are formed to be electrically open.

9. A surface acoustic wave resonator according to claim 1, wherein both end portions of the periodically arranged electrodes of the auxiliary reflector electrode are formed to be electrically open.

10. A surface acoustic wave resonator according to claim 1, wherein the auxiliary reflector electrode includes two bus bar electrodes and has a configuration in which electrode fingers extending from the bus bar electrodes in a generally perpendicular direction are intersected with each other.

11. A surface acoustic wave resonator according to claim 1, wherein the pitch of the periodically arranged electrodes of the auxiliary reflector electrode is different from the pitch of the reflector electrodes.

12. A surface acoustic wave resonator according to claim 1, wherein the pitch of the periodically arranged electrodes of the auxiliary reflector electrode is different from the pitch of the IDT electrode.

13. A surface acoustic wave filter comprising a plurality of the surface acoustic wave resonators set forth in claim 1 provided on a piezoelectric substrate.

14. A communications equipment comprising the surface acoustic wave filter set forth in claim 13 incorporated therein.

15. A surface acoustic wave duplexer comprising a transmission filter section and a receiving filter section provided on a piezoelectric substrate, which includes the surface acoustic wave resonator set forth in claim 1 at least in one of the transmission filter section and the receiving filter section.

16. A communications equipment comprising the surface acoustic wave duplexer set forth in claim 15 incorporated therein.

17. A communications equipment comprising the surface acoustic wave resonator set forth in claim 1 incorporated therein.

\* \* \* \* \*